(12) United States Patent
Choi et al.

(10) Patent No.: US 12,408,343 B2
(45) Date of Patent: Sep. 2, 2025

(54) SEMICONDUCTOR MEMORY DEVICE AND MANUFACTURING METHOD OF SEMICONDUCTOR MEMORY DEVICE

(71) Applicant: SK hynix Inc., Icheon-si (KR)

(72) Inventors: Ga Ram Choi, Icheon-si (KR); Dae Hyun Kim, Icheon-si (KR); Changhan Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 367 days.

(21) Appl. No.: 18/073,908

(22) Filed: Dec. 2, 2022

(65) Prior Publication Data

US 2024/0015965 A1 Jan. 11, 2024

(30) Foreign Application Priority Data

Jul. 5, 2022 (KR) .......................... 10-2022-0082182

(51) Int. Cl.
*H10B 43/27* (2023.01)
*H10B 41/27* (2023.01)
*H10B 51/20* (2023.01)
*H10B 63/00* (2023.01)

(52) U.S. Cl.
CPC ............. *H10B 43/27* (2023.02); *H10B 41/27* (2023.02); *H10B 51/20* (2023.02); *H10B 63/34* (2023.02)

(58) Field of Classification Search
CPC ........ H10B 43/27; H10B 41/27; H10B 51/20; H10B 63/34; H10B 41/50; H10B 51/50; H10B 63/30; H10B 41/35; H10B 43/35; H10B 43/50; H10B 51/30
See application file for complete search history.

(56) References Cited

U.S. PATENT DOCUMENTS

| 11,302,626 B2* | 4/2022 | Lee ........................ H10D 1/716 |
| 11,690,233 B2* | 6/2023 | Kim ....................... H10B 69/00 257/532 |
| 2024/0381640 A1* | 11/2024 | Lee ..................... H01L 23/5226 |

FOREIGN PATENT DOCUMENTS

| KR | 1020130070153 A | 6/2013 |
| KR | 1020210073178 A | 6/2021 |

* cited by examiner

*Primary Examiner* — Allison Bernstein
(74) *Attorney, Agent, or Firm* — WILLIAM PARK & ASSOCIATES LTD.

(57) ABSTRACT

There are provided a semiconductor memory device and a method of manufacturing the semiconductor memory device. The semiconductor memory device includes a doped semiconductor layer including an upper surface facing a first direction, a multifunctional stack including a plurality of interlayer insulating layers and a plurality of conductive layers stacked alternately with each other in the first direction above the doped semiconductor layer, the multifunctional stack including a groove, a liner insulating layer on a bottom surface of the groove, a liner semiconductor layer on the liner insulating layer, and a first electrode and a second electrode spaced apart from each other in the groove and extending in the first direction from the liner semiconductor layer.

36 Claims, 26 Drawing Sheets

SEMICONDUCTOR MEMORY DEVICE AND MANUFACTURING METHOD OF SEMICONDUCTOR MEMORY DEVICE

CROSS-REFERENCE TO RELATED APPLICATION

The present application claims priority under 35 U.S.C. § 119(a) to Korean patent application number 10-2022-0082182 filed on Jul. 5, 2022, in the Korean Intellectual Property Office, the entire disclosure of which is incorporated by reference herein.

BACKGROUND

1. Technical Field

Various embodiments of the present disclosure relate to a semiconductor memory device and a method of manufacturing the semiconductor memory device, and more particularly, to a three-dimensional semiconductor memory device and a method of manufacturing the three-dimensional semiconductor memory device.

2. Related Art

A test pattern may be formed to measure electrical characteristics of a semiconductor memory device. In a three-dimensional semiconductor memory device which has been proposed for improvement of integration density, a test pattern may be formed through a process which is independent from a process of forming a cell array structure. As a result, reliability of data obtained through the test pattern is not high.

SUMMARY

According to an embodiment, a semiconductor memory device may include a first doped semiconductor layer and a second doped semiconductor layer each having an upper surface facing a first direction, the first and second doped semiconductor layers spaced apart from each other, a multifunctional stack including a plurality of first interlayer insulating layers and a plurality of first conductive layers stacked alternately with each other in the first direction above the first doped semiconductor layer, the multifunctional stack including a groove, a liner insulating layer on a bottom surface of the groove, a liner semiconductor layer on the liner insulating layer, a first electrode and a second electrode spaced apart from each other in the groove and extending in the first direction from the liner semiconductor layer, a gate stack including a plurality of second interlayer insulating layers and a plurality of second conductive layers stacked alternately with each other in the first direction on the second doped semiconductor layer, the gate stack including a vertical hole, a memory layer on a side portion of the vertical hole, and a vertical semiconductor layer arranged on the memory layer.

According to an embodiment, a semiconductor memory device may include a doped semiconductor layer including an upper surface facing a first direction, a multifunctional stack including a plurality of interlayer insulating layers and a plurality of conductive layers stacked alternately with each other in the first direction above the doped semiconductor layer, the multifunctional stack including a groove, a liner insulating layer on a bottom surface of the groove, a liner semiconductor layer on the liner insulating layer, and a first electrode and a second electrode spaced apart from each other in the groove and extending in the first direction from the liner semiconductor layer, wherein at least one of the plurality of conductive layers is located between the liner insulating layer and the doped semiconductor layer.

According to an embodiment, a semiconductor memory device may include a first doped semiconductor layer and a second doped semiconductor layer each including an upper surface facing a first direction, the first and second doped semiconductor layers spaced apart from each other, a test group overlapping the first doped semiconductor layer, and a three-dimensional memory cell array structure overlapping the second doped semiconductor layer. The test group may comprise a plurality of multifunctional stacks including a plurality of interlayer insulating layers and a plurality of conductive layers stacked alternately with each other in the first direction above the first doped semiconductor layer, the plurality of multifunctional stacks including a plurality of grooves, a plurality of liner insulating layers arranged on a plurality of bottom surfaces corresponding to the plurality of grooves, respectively, a plurality of liner semiconductor layers arranged on the plurality of liner insulating layers, respectively, a plurality of filling insulating layers arranged in the plurality of grooves, and a plurality of electrode pairs passing through the plurality of filling insulating layers and connected to the plurality of liner semiconductor layers.

According to an embodiment, a method of manufacturing a semiconductor memory device may include forming a multifunctional stack including a groove and a gate stack including a vertical hole, forming a memory layer on a side portion of the vertical hole, forming a liner insulating layer on a surface of the groove while the memory layer is formed, forming a vertical semiconductor layer on the memory layer, forming a liner semiconductor layer on the liner insulating layer while the vertical semiconductor layer is formed, and forming a first electrode and a second electrode connected to the liner semiconductor layer and spaced apart from each other in the groove.

DETAILED DESCRIPTION

The specific structural and functional descriptions disclosed herein are merely illustrative for the purpose of describing embodiments according to the concept of the present disclosure. The embodiments according to the concept of the present disclosure can be modified in various forms and replaced with other equivalent embodiments. Thus the present disclosure should not be construed as limited to the embodiments set forth herein.

It will be understood that, although the terms "first," "second," etc. may be used herein to describe various elements, these elements should not be limited by these terms. These terms are only used to distinguish one element from another element, and the order or number of components is not limited by the terms. Also, when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present. Like numerals refer to like elements throughout.

Various embodiments are directed to a semiconductor memory device improving reliability of data obtained through a test pattern and a method of manufacturing the semiconductor memory device.

Figure 1:
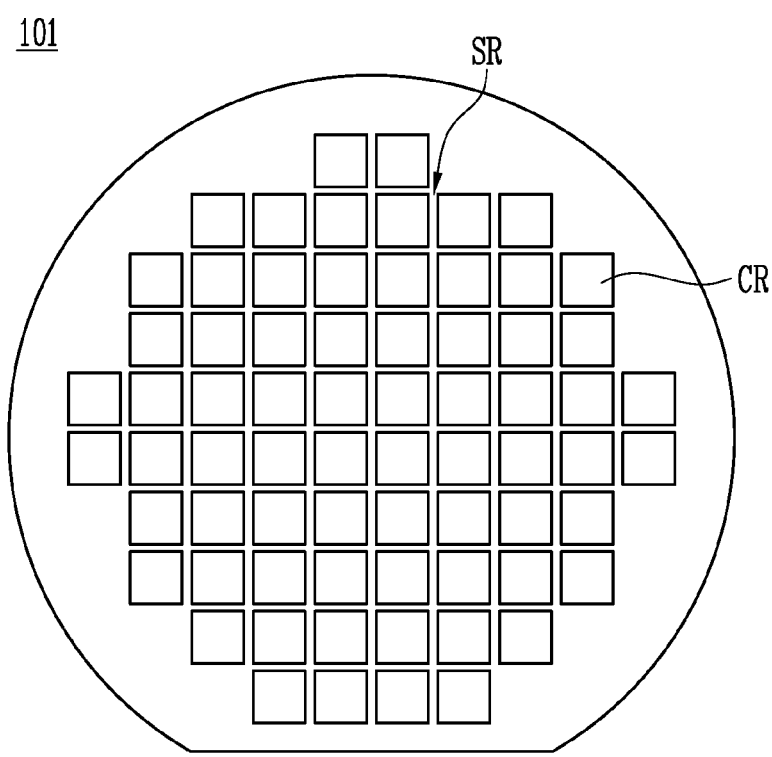
FIG. 1 is a diagram illustrating a substrate according to an embodiment of the present disclosure.

FIG. 1 is a diagram illustrating a substrate 101 according to an embodiment of the present disclosure.

Referring to FIG. 1, the substrate 101 may include a plurality of chip regions CR and a scribe region SR between the plurality of chip regions CR. The plurality of chip regions CR may be divided by the scribe region SR. Each of the chip regions CR may be surrounded by the scribe region SR.

According to an embodiment, a three-dimensional memory cell array structure which includes a plurality of memory cells arranged in three dimensions in each of the chip regions CR. A test pattern which represents electrical characteristics of the memory cells of the three-dimensional memory cell array structure may be disposed in a test region of the substrate 101. The test region may be disposed in each of the chip regions CR or may be disposed in the scribe region SR. Operations of the memory cells may be controlled by a peripheral logic circuit. The peripheral logic circuit may include a row decoder, a column decoder, a page buffer, a control circuit, and the like. According to an embodiment, a peripheral circuit structure for the peripheral logic circuit may be formed in each of the chip regions CR. The chip region CR may include a memory cell array region and a peripheral circuit region. The memory cell array region may be provided for the three-dimensional memory cell array structure. The peripheral circuit structure may be formed in the peripheral circuit region in the chip region CR, or may overlap the three-dimensional memory cell array structure. According to another embodiment, the peripheral circuit structure may be formed on a separate substrate. The peripheral circuit structure and the three-dimensional memory cell array structure may be coupled to each other by bonding a bonding pad coupled to the three-dimensional memory cell array structure and a bonding pad coupled to the peripheral circuit structure to each other.

The three-dimensional memory cell array structure may include a gate stack, a vertical semiconductor layer in the gate stack, and a memory layer between the vertical semiconductor layer and the gate stack. A test pattern according to embodiments of the present disclosure may include a multifunctional stack, a liner semiconductor layer in the multifunctional stack, and a liner insulating layer between the liner semiconductor layer and the multifunctional stack.

Figure 2:
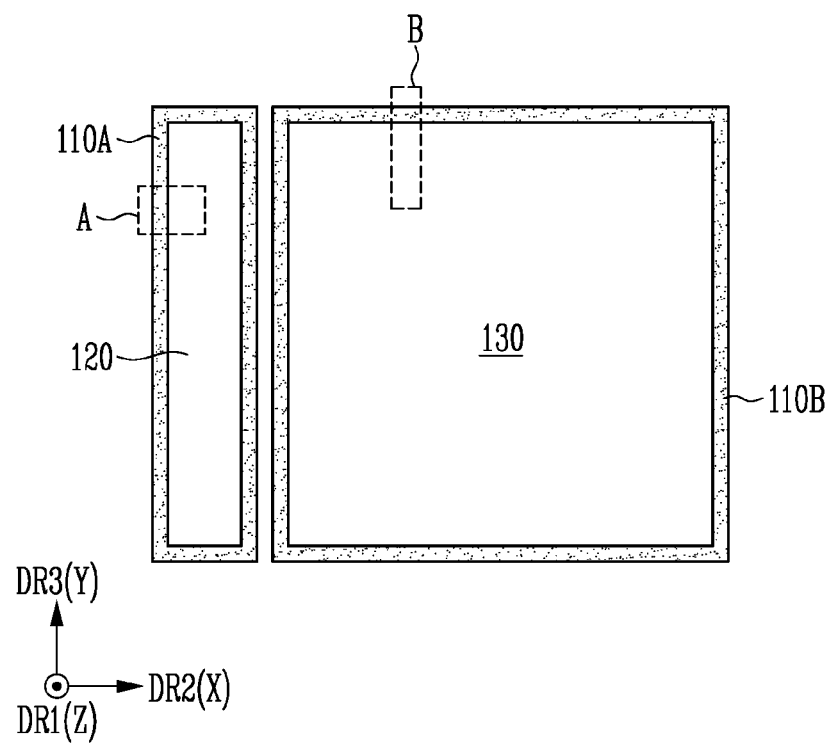
FIG. 2 is a plan view illustrating a semiconductor memory device according to an embodiment of the present disclosure.

FIG. 2 is a plan view illustrating a semiconductor memory device according to an embodiment of the present disclosure.

Referring to FIG. 2, a semiconductor memory device may include a first doped semiconductor layer 110A, a second doped semiconductor layer 110B, a test group 120, and a three-dimensional memory cell array structure 130. The first doped semiconductor layer 110A and the test group 120 may be formed in a test region which is provided in at least one of the chip region CR and the scribe region SR of the substrate 101 as shown in FIG. 1. The second doped semiconductor layer 110B and the three-dimensional memory cell array structure 130 may be arranged in the chip region CR of the substrate 101 as shown in FIG. 1.

The first doped semiconductor layer 110A and the second doped semiconductor layer 110B may be arranged above the substrate 101 as shown in FIG. 1. A top surface of the first doped semiconductor layer 110A and a top surface of the second doped semiconductor layer 110B may face in a first direction DR1. The first doped semiconductor layer 110A and the second doped semiconductor layer 110B may be spaced apart from each other in a direction in which the top surfaces thereof extend. According to an embodiment, the first doped semiconductor layer 110A and the second doped semiconductor layer 110B may be spaced apart from each other in a second direction DR2. The first doped semiconductor layer 110A and the second doped semiconductor layer 110B may extend next to each other. According to an embodiment, the first doped semiconductor layer 110A and the second doped semiconductor layer 110B may extend in a third direction DR3. The first direction DR1, the second direction DR2, and the third direction DR3 may be defined as directions in which axes crossing each other extend. According to an embodiment, the first direction DR1, the second direction DR2, and the third direction DR3 may be defined as a Z-axis direction, an X-axis direction, and a Y-axis direction, respectively. The first doped semiconductor layer 110A and the second doped semiconductor layer 110B may be spaced apart from each other in the XY plane. In an embodiment, the first doped semiconductor layer 110A and the second doped semiconductor layer 110B may be spaced apart from each other and do not overlap one another in the first direction DR1, as for example, shown in FIG. 2.

The test group 120 may be arranged to overlap the first doped semiconductor layer 110A. The test group 120 may include a plurality of test patterns to test electrical characteristics of the three-dimensional memory cell array structure 130. According to an embodiment, the test group 120 may include at least one of a capacitor and a transistor.

The three-dimensional memory cell array structure 130 may be arranged to overlap the second doped semiconductor layer 110B. The three-dimensional memory cell array structure 130 may include a non-volatile memory cell array such as a NAND flash memory cell array, a ferroelectric memory cell array, and a phase change memory cell array. The second doped semiconductor layer 110B may be provided as a source layer which is coupled to a NAND flash memory cell array, or a lower structure of a ferroelectric memory cell array or a lower structure of a phase change memory cell array. The structure of the second doped semiconductor layer 110B, which is provided as the lower structure of the ferroelectric memory cell array or the lower structure of the phase change memory cell array, is not limited to that shown in FIG. 2, and may be separated into a plurality of line patterns.

Figure 3A:
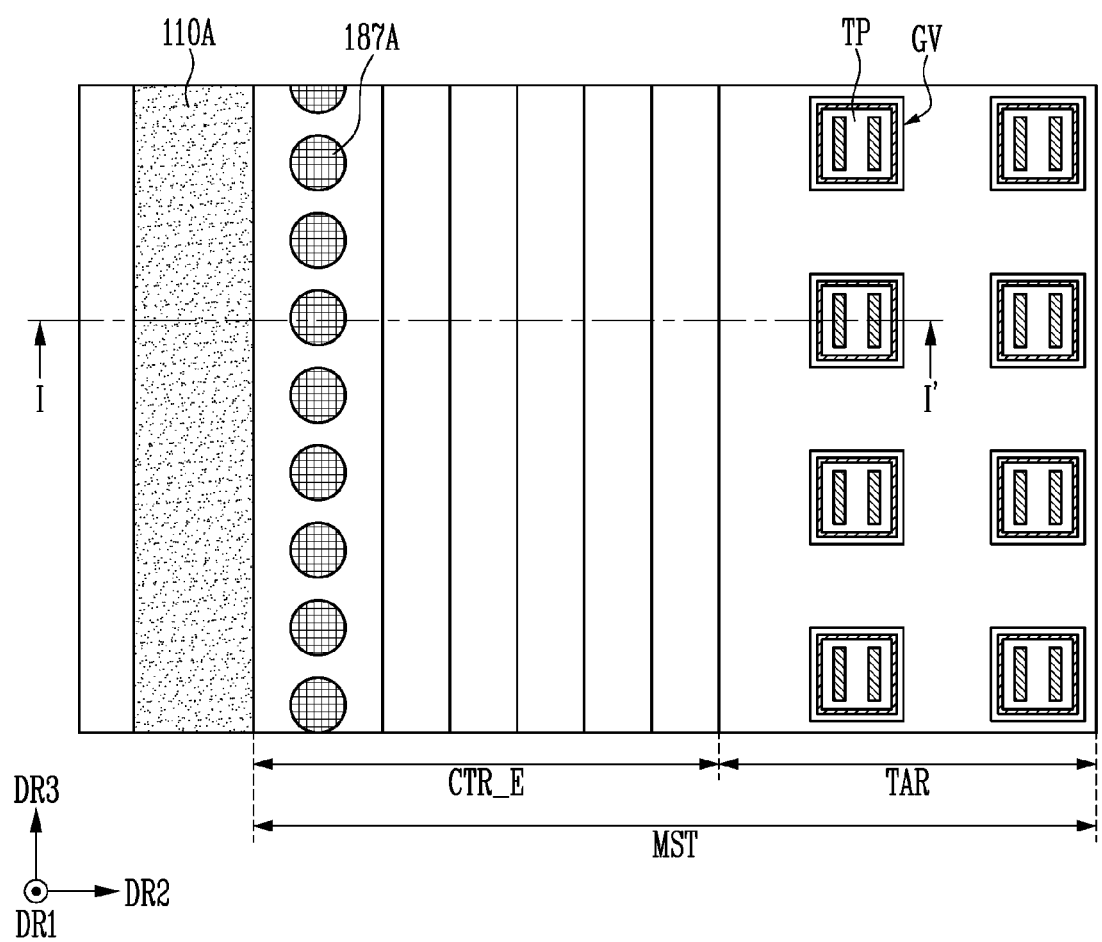
FIGS. 3A and 3B are enlarged plan views of an area A and an area B, respectively, of FIG. 2.
Figure 3B:
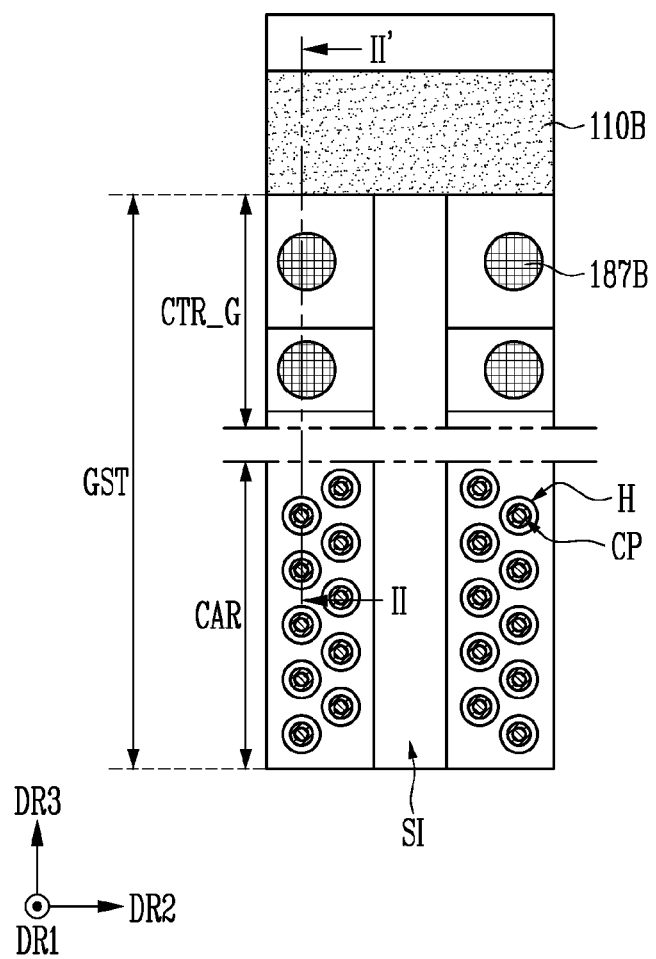

FIGS. 3A and 3B are enlarged plan views of an area A and an area B, respectively, of FIG. 2.

Referring to FIGS. 2 and 3A, the test group 120 may include a multifunctional stack MST. The multifunctional stack MST may include a plurality of layers which are stacked on the first doped semiconductor layer 110A. The multifunctional stack MST may include a test pattern array region TAR and an electrode contact region CTR_E.

The plurality of layers of the multifunctional stack MST may form a stepped structure in the electrode contact region CTR_E. At least one contact plug 187A may overlap the electrode contact region CTR_E of the multifunctional stack MST. According to an embodiment, a plurality of contact plugs 187A may be spaced apart from each other along at least one step among a plurality of steps which constitute the stepped structure of the electrode contact region CTR_E. However, embodiments of the present disclosure are not limited thereto. According to another embodiment, a contact plug corresponding to at least one of the steps of the stepped structure of the electrode contact region CTR_E may extend continuously in a bar type along the one step.

The multifunctional stack MST may include a plurality of grooves GV. The plurality of grooves GV may be spaced apart from each other in the second direction DR2 and the third direction DR3. A plurality of test patterns TP may be arranged in the plurality of grooves GV, respectively. The plurality of grooves GV and the plurality of test patterns TP may be arranged in the test pattern array region TAR.

Referring to FIGS. 2 and 3B, the three-dimensional memory cell array structure 130 may include a plurality of gate stacks GST. The gate stacks GST which are adjacent to each other may be separated from each other by a slit SI. Though not shown, a vertical structure may be disposed in the slit SI. According to an embodiment, the vertical structure may include an insulating material which fills space between the neighboring gate stacks GST. According to another embodiment, the vertical structure may include a sidewall insulating layer on a side wall of the gate stack GST, and a vertical conductor. The vertical conductor may be separated from the gate stack GST while interposing the sidewall insulating layer between the vertical conductor and the gate stack GST, and may be connected to the second doped semiconductor layer 110B.

The gate stack GST may include a plurality of layers which are stacked above the second doped semiconductor layer 110B. The gate stacks GST may include a cell array region CAR and a gate contact region CTR_G.

The plurality of layers of the gate stack GST may form a stepped structure in the gate contact region CTR_G. A plurality of gate contact plugs 187B may overlap a plurality of steps which define a stepped structure in the gate contact region CTR_G.

Each of the gate stacks GST may include a plurality of vertical holes H. The plurality of vertical holes H may be spaced apart from each other in the second direction DR2 and the third direction DR3. A plurality of cell plugs CP may be arranged in the plurality of vertical holes H, respectively. The plurality of vertical holes H and the plurality of cell plugs CP may be formed in the cell array region CAR of the gate stack GST.

Referring to FIGS. 3A and 3B, in a planar view, the groove GV may have a greater area than the vertical hole H. The test pattern TP and the cell plug CP may extend in the first direction DR1.

Figure 4A:
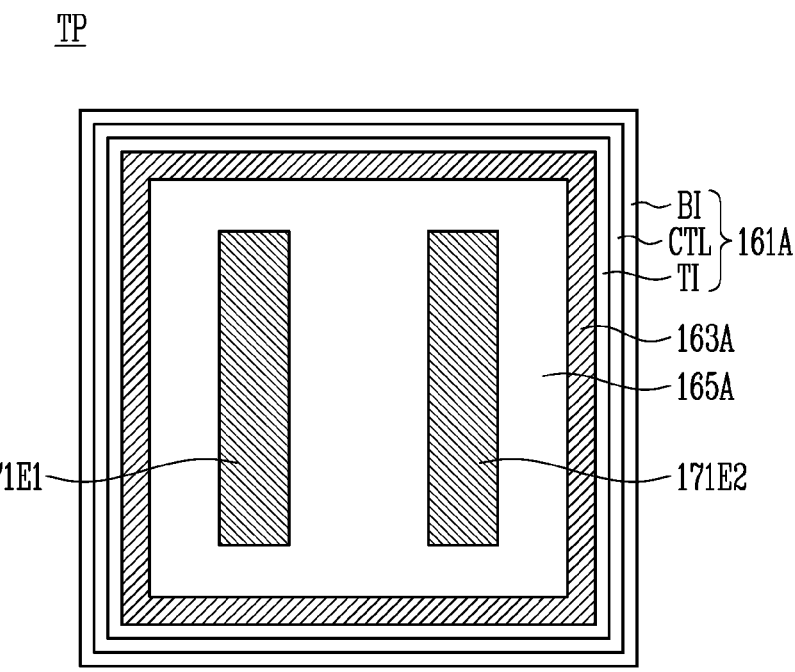
FIGS. 4A and 4B are enlarged plan views of a test pattern and a cell plug according to an embodiment of the present disclosure.
Figure 4B:
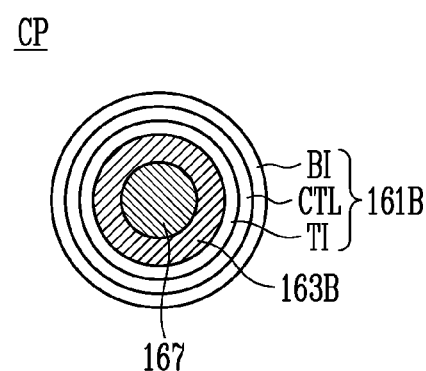

FIGS. 4A and 4B are enlarged plan views of a test pattern and a cell plug according to an embodiment of the present disclosure.

Referring to FIG. 4A, the test pattern TP may include a liner insulating layer 161A, a liner semiconductor layer 163A, a first electrode 171E, and a second electrode 171E2. The liner semiconductor layer 163A may be insulated from the first electrode 171E1 and the second electrode 171E2 by a filling insulating layer 165A. While the filling insulating layer 165A surrounds the first electrode 171E1 and the second electrode 171E2, the filling insulating layer 165A may insulate the first and second electrodes 171E1 and 171E2 from each other. The liner semiconductor layer 163A may surround the filling insulating layer 165A. The liner insulating layer 161A may be interposed between the multifunctional stack MST as shown in FIG. 3A and the liner semiconductor layer 163A.

Referring to FIG. 4B, the cell plug CP may include a memory layer 161B, a vertical semiconductor layer 163B, and a conductive capping pattern 167. The vertical semiconductor layer 163B may surround the conductive capping pattern 167. The memory layer 161B may surround the vertical semiconductor layer 163B.

Referring to FIGS. 4A and 4B, the liner insulating layer 161A of the test pattern TP may have the same material as the memory layer 161B so as to represent characteristics of the memory layer 161B.

The memory layer 161B may serve as data storage layers of various memory cells, for example, a data storage layer of a NAND flash memory cell, a data storage layer of a ferroelectric memory cell, or a data storage layer of a phase change memory cell. According to an embodiment, when the memory layer 161B is provided as a data storage layer of a phase change memory cell, each of the memory layer 161B and the liner insulating layer 161A may include a phase change layer. According to another embodiment, when the memory layer 161B is provided as a data storage layer of a ferroelectric memory cell, each of the memory layer 161B and the liner insulating layer 161A may include a ferroelectric layer. According to another embodiment, when the memory layer 161B is provided as a data storage layer of a NAND flash memory cell, each of the memory layer 161B and the liner insulating layer 161A may include a floating gate layer, an insulating layer including conductive nanodots, or a charge trap layer CTL. Hereinafter, embodiments of the present disclosure will be described based on an example where the memory layer 161B includes the charge trap layer CTL. However, the present disclosure is not limited thereto.

Each of the liner insulating layer 161A and the memory layer 161B may further include a tunnel insulating layer TI and a blocking insulating layer BI which are separated from each other with the charge trap layer CTL interposed therebetween. The charge trap layer CTL may include a silicon nitride layer. The blocking insulating layer BI may be interposed between the liner semiconductor layer 163A or the vertical semiconductor layer 163B corresponding thereto and the charge trap layer CTL. The blocking insulating layer BI may include an insulating material which blocks the movement of charges. According to an embodiment, the blocking insulating layer BI may include a silicon oxide layer, a high-k dielectric oxide layer such as an aluminum oxide layer or a hafnium oxide layer, or a combination of the silicon oxide layer and the high-k dielectric oxide layer. The tunnel insulating layer TI may include an insulating material that enables tunneling. According to an embodiment, the tunnel insulating layer TI may include a silicon oxide layer.

The liner semiconductor layer 163A of the test pattern TP may include the same semiconductor material as the vertical semiconductor layer 163B to represent characteristics of the vertical semiconductor layer 163B of the cell plug CP.

The vertical semiconductor layer 163B may be provided as a channel layer, or as a vertical electrode. The NAND flash memory cell array may include a plurality of memory cell strings. Each of the memory cell string may include a plurality of memory cells which are coupled in series by a channel layer. According to an embodiment, the vertical semiconductor layer 163B may be provided as a channel layer. According to another embodiment, the vertical semiconductor layer 163B may be provided as a vertical electrode for controlling a ferroelectric memory cell, or a vertical electrode for controlling a phase change memory cell. Hereinafter, embodiments of the present disclosure will be described based on an example in which the vertical semiconductor layer 163B is provided as a channel layer of a memory cell string. However, the embodiments are not limited thereto.

Each of the liner semiconductor layer 163A and the vertical semiconductor layer 163B may include a semiconductor material which includes silicon, germanium, or a combination thereof. Each of the liner semiconductor layer 163A and the vertical semiconductor layer 163B may be a doped semiconductor layer doped with impurities, an undoped semiconductor, or a semiconductor partially doped with impurities.

The first electrode 171E1 and the second electrode 171E2 of the test pattern TP may include a semiconductor material doped with impurities.

The conductive capping pattern 167 of the cell plug CP may include a conductive material formed of a semiconductor material doped with impurities, metal, or a combination thereof.

Figure 5A:
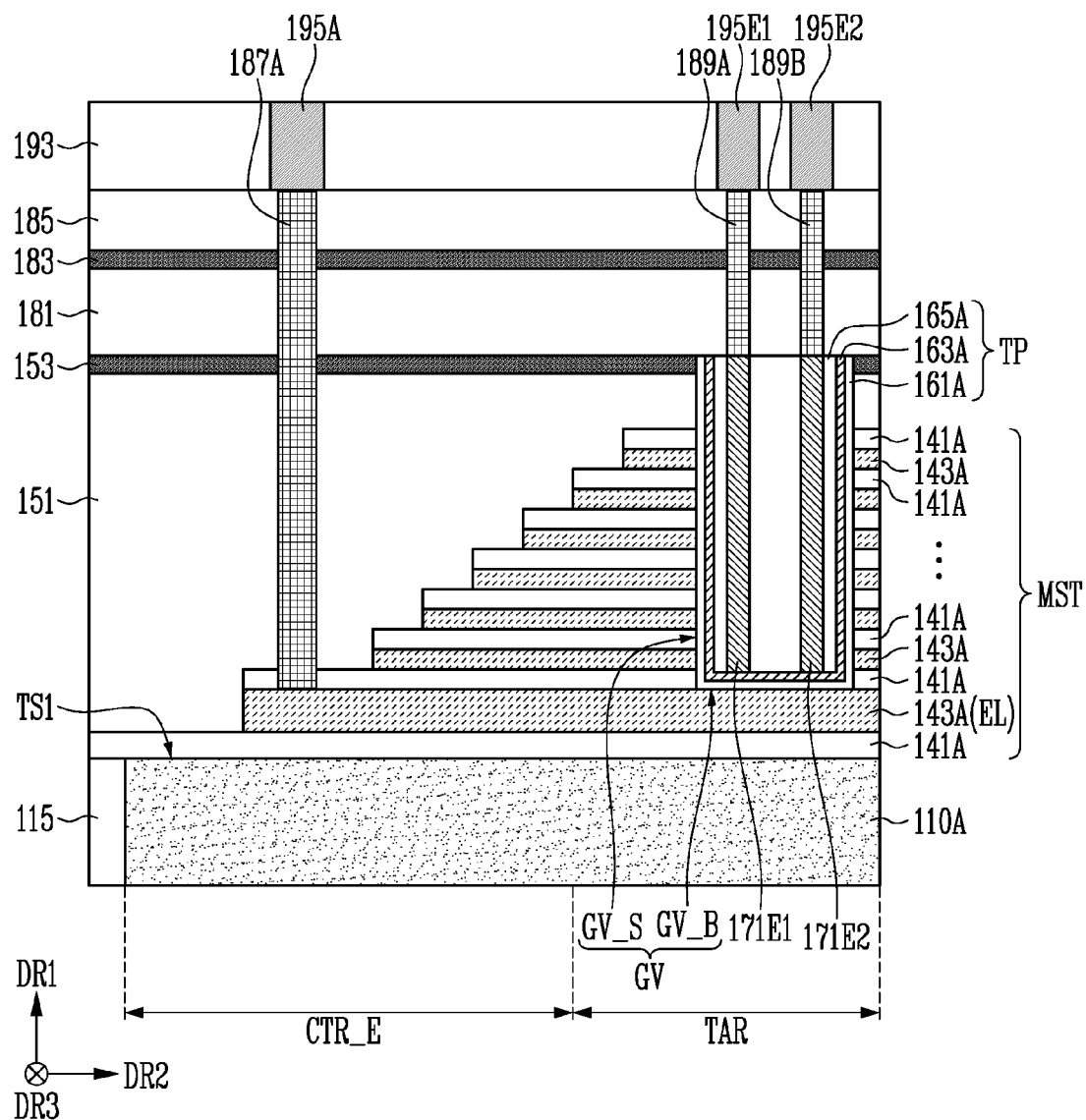
FIGS. 5A and 5B are cross-sectional views illustrating a test region and a memory cell array region of a semiconductor memory device according to an embodiment of the present disclosure.
Figure 5B:
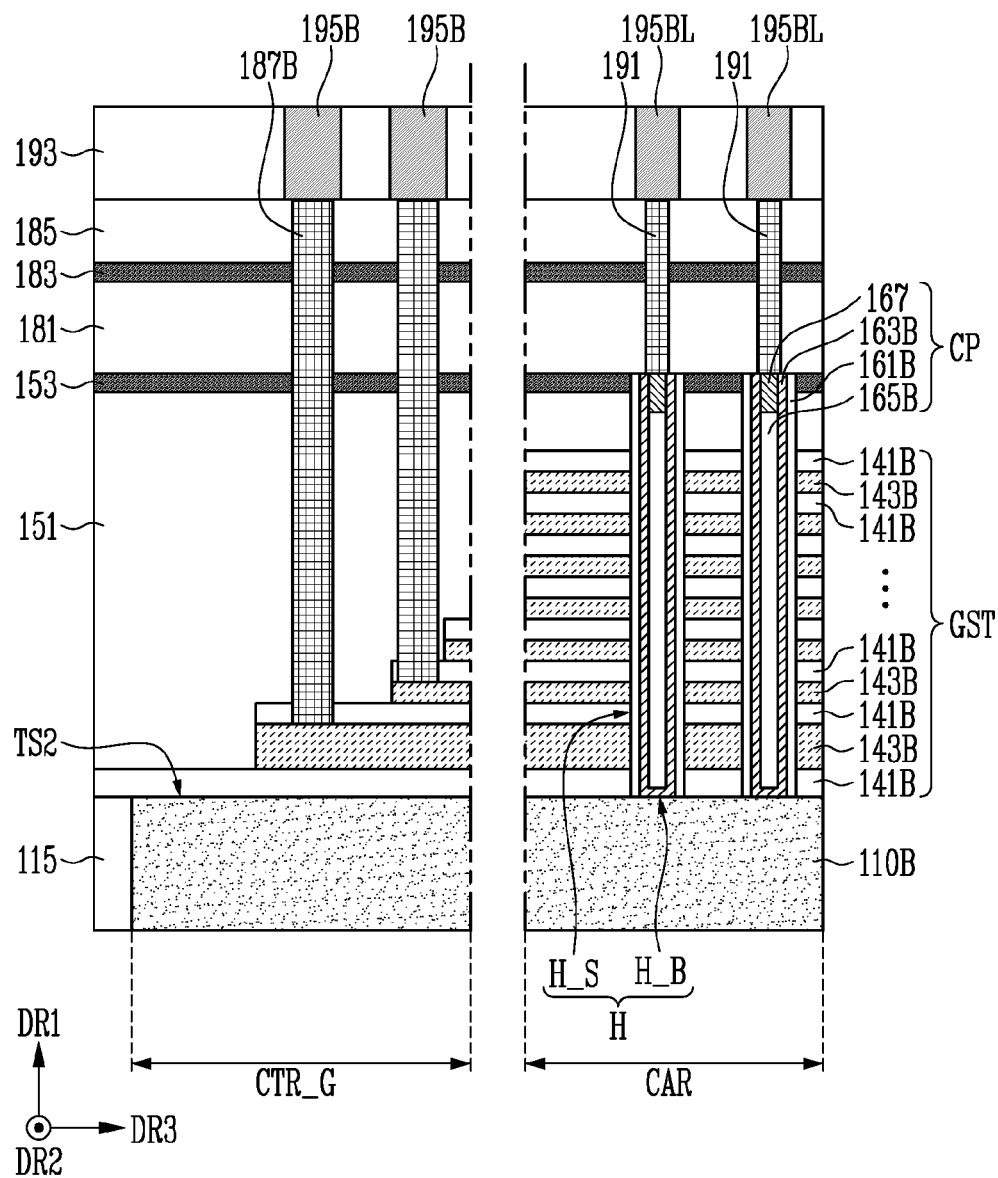

FIGS. 5A and 5B are cross-sectional views illustrating a test region and a memory cell array region of a semiconductor memory device according to an embodiment of the present disclosure. FIG. 5A is a cross-sectional diagram of a test region taken along line I-I' shown in FIG. 3A. FIG. 5B is a cross-sectional diagram of a memory cell array region taken along line II-II' as shown in FIG. 3B.

Referring to FIGS. 5A and 5B, the first doped semiconductor layer 110A and the second doped semiconductor layer 110B may be arranged at substantially the same level and may include upper surfaces TS1 and TS2, respectively. The first doped semiconductor layer 110A and the second doped semiconductor layer 110B may be divided by a lower insulating layer 115. In the cross-sectional diagrams below, components arranged under the first doped semiconductor layer 110A and the second doped semiconductor layer 110B are omitted. However, the substrate 101 as shown in FIG. 1 may be arranged under the first doped semiconductor layer 110A and the second doped semiconductor layer 110B.

The first doped semiconductor layer 110A and the second doped semiconductor layer 110B may include a semiconductor material doped with at least one of n type impurities and p type impurities. According to an embodiment, each of the first doped semiconductor layer 110A and the second doped semiconductor layer 110B may include an n type doped semiconductor layer which includes n type impurities as majority carriers.

The multifunctional stack MST and the gate stack GST may be arranged at substantially the same level and be separated from each other by etching the plurality of layers stacked in the first direction DR1. The plurality layers of the multifunctional stack MST may include a plurality of first interlayer insulating layers 141A and a plurality of first conductive layers 143A which are stacked alternately with each other above the first doped semiconductor layer 110A in the first direction DR1. A plurality of layers of the gate stack GST may include a plurality of second interlayer insulating layers 141B and a plurality of second conductive layers 143B which are stacked alternately with each other on the second doped semiconductor layer 110B in the first direction DR1.

The plurality of first interlayer insulating layers 141A of the multifunctional stack MST may be arranged at substantially the same level as the plurality of second interlayer insulating layers 141B of the gate stack GST. The plurality of first interlayer insulating layers 141A and the plurality of second interlayer insulating layers 141B may have the same insulating material. According to an embodiment, each of the plurality of first interlayer insulating layers 141A and the plurality of second interlayer insulating layers 141B may include a silicon oxide layer. The plurality of first conductive layers 143A of the multifunctional stack MST may be arranged at substantially the same level as the plurality of second conductive layers 143B of the gate stack GST. The plurality of first conductive layers 143A and the plurality of second conductive layers 143B may have the same conductive material. The plurality of first conductive layers 143A and the plurality of second conductive layers 143B may include a single layer or a multilayer such as a double layer. The plurality of first conductive layers 143A and the plurality of second conductive layers 143B may include at least one of a doped semiconductor layer, metal, a conductive metal nitride layer, and a transition metal.

A first insulating layer 151 may be provided on the multifunctional stack MST and the gate stack GST. The first insulating layer 151 may cover a stepped structure provided in the electrode contact region CTR_E of the multifunctional stack MST and a stepped structure provided in the gate contact region CTR_G of the gate stack GST. A plurality of insulating layers with predetermined etch selectivities may be arranged on the first insulating layer 151. According to an embodiment, a second insulating layer 153, a third insulating layer 181, a fourth insulating layer 183, a fifth insulating layer 185, and a sixth insulating layer 193 may be stacked on the first insulating layer 151 in the first direction DR1. The second insulating layer 153 and the fourth insulating layer 183 may include an insulating material having an etch selectivity with respect to the first insulating layer 151, the third insulating layer 181, the fifth insulating layer 185, and the sixth insulating layer 193. According to an embodiment, the first insulating layer 151, the third insulating layer 181, the fifth insulating layer 185, and the sixth insulating layer 193 may include a silicon oxide layer, and the second insulating layer 153 and the fourth insulating layer 183 may include a silicon nitride layer. The stacked structure of the insulating layers on the first insulating layer 151 might not be limited to the drawing and may have various designs. The word "predetermined" as used herein with respect to a parameter, such as a predetermined etch selectivities or distance, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Referring to FIG. 5A, the first conductive layers 143A of the multifunctional stack MST may extend from the test pattern array region TAR to the electrode contact region CTR_E, and may be stacked to form a stepped structure in the electrode contact region CTR_E. End portions of the plurality of first conductive layers 143A may form a stepped structure in the electrode contact region CTR_E.

The liner insulating layer 161A, the liner semiconductor layer 163A, the filling insulating layer 165A, the first electrode 171E1, and the second electrode 171E2 may be arranged in the groove GV of the multifunctional stack MST. A bottom surface GV_B of the groove GV may have various depths in the multifunctional stack MST so that the bottom surface GV_B may be defined by one of the plurality of first conductive layers 143A. According to an embodiment, the lowermost first conductive layer among the plurality of first conductive layers 143A may define the bottom surface GV_B of the groove GV. The first conductive layer which defines the bottom surface GV_B of the groove GV may serve as a third electrode conductive layer EL of the test pattern TP.

The liner insulating layer 161A may be arranged on the bottom surface GV_B of the groove GV and may extend along a side portion GV_S of the groove GV. The liner semiconductor layer 163A may be arranged on the liner insulating layer 161A and may extend along the bottom surface GV_B of the groove GV and the side portion GV_S of the groove GV with the liner insulating layer 161A interposed therebetween.

The filling insulating layer 165A may be arranged in the groove GV on the liner semiconductor layer 163A. The first electrode 171E1 and the second electrode 171E2 may extend from the liner semiconductor layer 163A in the first direction DR1 to pass through the filling insulating layer 165A. The first electrode 171E1 and the second electrode 171E2 may be separated from each other.

The liner insulating layer 161A, the liner semiconductor layer 163A, the filling insulating layer 165A, the first electrode 171E1, and the second electrode 171E2 may protrude in the first direction DR1 more than the multifunctional stack MST. According to an embodiment, the liner insulating layer 161A, the liner semiconductor layer 163A, the filling insulating layer 165A, the first electrode 171E, and the second electrode 171E2 may extend in the first direction DR1 to pass through the first insulating layer 151 and the second insulating layer 153.

According to embodiments of the present disclosure, at least one of the plurality of first conductive layers 143A might not be penetrated by the groove GV and may extend between the liner insulating layer 161A and the first doped semiconductor layer 110A. The first conductive layer, which extends between the liner insulating layer 161A and the first doped semiconductor layer 110A and contacts the liner insulating layer 161A, may be provided as the above-described third electrode conductive layer EL. The contact plug 187A may extend in the first direction DR1 from the end portion of the third electrode conductive layer EL to pass through the first insulating layer 151, the second insulating layer 153, the third insulating layer 181, the fourth insulating layer 183, and the fifth insulating layer 815. The contact plug 187A may include a single conductive layer, or a plurality of layers including two or more layers which are stacked in the first direction DR1.

The first electrode 171E1 and the second electrode 171E2 may be coupled to a first upper contact plug 189A and a second upper contact plug 189B, respectively. The first upper contact plug 189A and the second upper contact plug 189B may extend from the first electrode 171E1 and the second electrode 171E2 to pass through the third insulating layer 181, the fourth insulating layer 183, and the fifth insulating layer 185. The first upper contact plug 189A and the second upper contact plug 189B may include metal.

A transistor or a capacitor may be defined by the test pattern TP and the third electrode conductive layer EL. According to an embodiment, the first electrode 171E1 and the second electrode 171E2 of the test pattern TP may serve as a source electrode and a drain electrode, respectively, and the third electrode conductive layer EL may be provided as a gate electrode. In this embodiment, the liner semiconductor layer 163A of the test pattern TP may be provided as a channel layer of a transistor, and the liner insulating layer 161A may serve as a gate insulating layer of the transistor. According to another embodiment, the liner semiconductor layer 163A of the test pattern TP may be provided as an upper electrode of a capacitor, and the first and second electrodes 171E1 and 171E2 may be provided as contact electrodes connected to the upper electrode. The third electrode conductive layer EL may be provided as a lower electrode of the capacitor, and the liner insulating layer 161A may be provided as an insulator of the capacitor.

Referring to FIG. 5B, the second conductive layers 143B of the gate stack GST may extend from the cell array region CAR to the gate contact region CTR_G, and may be stacked to form a stepped structure in the electrode contact region CTR_E. A plurality of end portions of the plurality of second conductive layers 143B may form a stepped structure in the gate contact region CTR_G. The gate contact plug 187B may extend in the first direction DR1 from the end portion of the second conductive layer 143B corresponding thereto to pass through the first insulating layer 151, the second insulating layer 153, the third insulating layer 181, the fourth insulating layer 183, and the fifth insulating layer 185. The gate contact plug 187B may include a single conductive layer, or a plurality of conductive layers including two or more layers which are stacked in the first direction DR1.

The memory layer 161B, the vertical semiconductor layer 163B, a core insulating layer 165B, and the conductive capping pattern 167 of the cell plug CP may be disposed in the vertical hole H of the gate stack GST. The vertical hole H, the memory layer 161B, and the vertical semiconductor layer 163B may pass through the plurality of second conductive layers 143B from a top of the gate stack GST to a bottom of the gate stack GST. In an embodiment, the vertical hole H, the memory layer 161B, and the vertical semiconductor layer 163B may pass through the plurality of second conductive layers 143B from an uppermost second conductive layer to a lowermost second conducive layer as, for example, shown in FIG. 5B. In an embodiment, the vertical hole H, the memory layer 161B, and the vertical semiconductor layer 163B may pass through the plurality of second conductive layers 143B in the first direction DR1 as, for example, shown in FIG. 5B. A bottom surface H_B of the vertical hole H may be defined by the second doped semiconductor layer 110B. The vertical hole H may completely pass through the plurality of second interlayer insulating layers 141B and the plurality of second conductive layers 143B of the gate stack GST.

The memory layer 161B may be arranged on a side portion H_S of the vertical hole H. The vertical semiconductor layer 163B may be coupled to the second doped semiconductor layer 110B through the bottom surface H_B of the vertical hole H, and may extend in the first direction DR1 along the memory layer 161B from the second doped semiconductor layer 110B. In an embodiment, the vertical semiconductor layer 163B may be directly coupled to the second doped semiconductor layer 110B through the bottom surface H_B of the vertical hole H. The memory layer 161B may be interposed between the vertical semiconductor layer 163B and the gate stack GST. The core insulating layer 165B and the conductive capping pattern 167 may be disposed in a central region of the vertical hole H. The conductive capping pattern 167 may overlap the core insulating layer 165B.

The cell plug CP may protrude in the first direction DR1 further than the gate stack GST. According to an embodiment, the cell plug CP may extend in the first direction DR1 to pass through the first insulating layer 151 and the second insulating layer 153.

The plurality of second conductive layers 143B may be divided into at least one second lower conductive layer adjacent to the second doped semiconductor layer 110B, a plurality of second intermediate conductive layers over the second lower conductive layer, and at least one second upper conductive layer over the plurality of second intermediate conductive layers. When the plurality of second conductive layers 143B are provided as gate electrodes of a NAND flash memory cell array structure, the second lower conductive layer may serve as a source select line connected to a gate electrode of the source select transistor, the plurality of second intermediate conductive layers may serve as a plurality of word lines connected to gate electrodes of the plurality of memory cells, and the second upper conductive layer may serve as a drain select line connected to a gate electrode of a drain select transistor.

The conductive capping pattern 167 may be connected to a third upper contact plug 191. The third upper contact plug 191 may extend to pass through the third insulating layer 181, the fourth insulating layer 183, and the fifth insulating layer 185. The third upper contact plug 191 may include metal.

Referring to FIGS. 5A and 5B, the sixth insulating layer 193 may be penetrated by a first wire 195E1, a second wire 195E2, a third wire 195A, a fourth wire 195B, and a fifth wire 195BL.

The first wire 195E1 may be connected to the first electrode 171E via the first upper contact plug 189A. The second wire 195E2 may be connected to the second electrode 171E2 via the second upper contact plug 189B. The first wire 195E1 and the second wire 195E2 may be provided as a source wire and a drain wire for transmitting an electrical signal to a transistor, or as a capacitor wire for transmitting an electrical signal to an upper electrode of a capacitor.

The third wire 195A may be connected to the third electrode conductive layer EL via the contact plug 187A. The third wire 195A may be provided as a gate wire for transmitting an electrical signal to the gate electrode of the transistor, or as wiring of the capacitor for transmitting an electrical signal to a lower electrode.

The fourth wire 195B may be connected to the second conductive layer 143B corresponding thereto via the gate contact plug 187B. The fifth wire 195BL may be connected to the conductive capping pattern 167 via the third upper contact plug 191. When the vertical semiconductor layer 163B of the cell plug CP is provided as a channel layer of a memory cell string included in a NAND flash memory cell array structure, the fifth wire 195BL may serve as a bit line.

According to embodiments of the present disclosure, the bottom surface GV_B of the groove GV may be located at a higher level than the bottom surface H_B of the vertical hole H in the first direction DR1.

Figure 6:
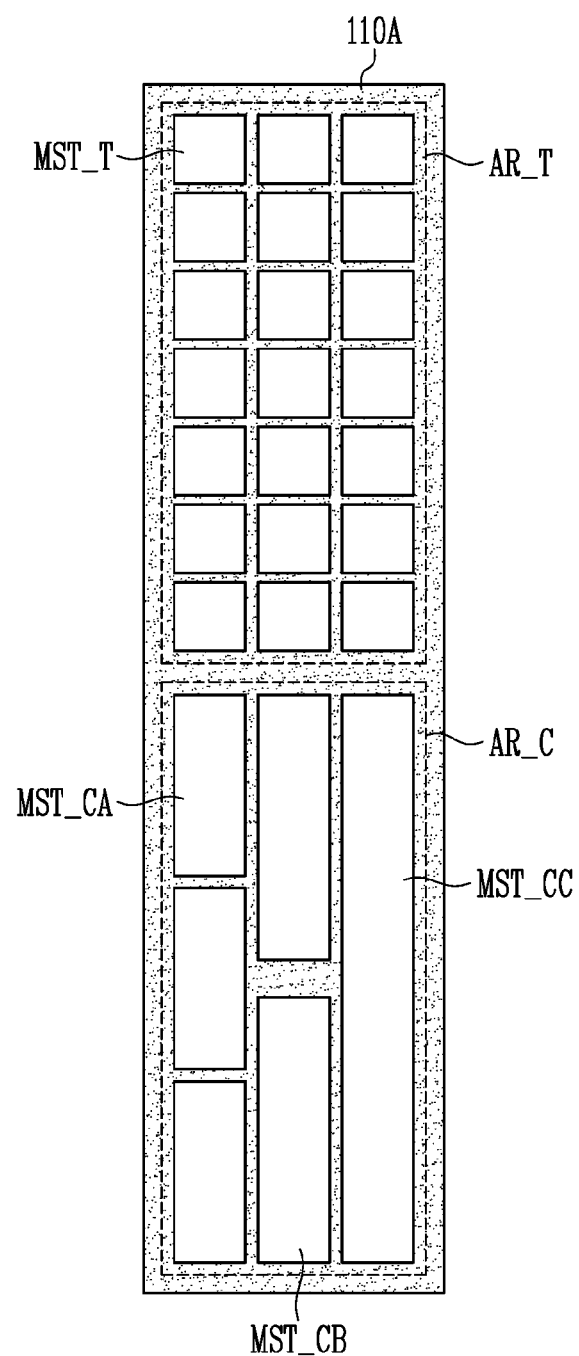
FIG. 6 is a plan view illustrating a test group according to an embodiment of the present disclosure.

FIG. 6 is a plan view illustrating a test group according to an embodiment of the present disclosure.

Referring to FIG. 6, the first doped semiconductor layer 110A which is arranged in the test region may include a transistor region AR_T and a capacitor region AR_C. The test group may include a plurality of multifunctional stacks MST_T arranged to overlap the transistor region AR_T and a plurality of multifunctional stacks MST_CA, MST_CB, and MST_CC arranged to overlap the capacitor region AR_C.

The plurality of multifunctional stacks MST_T over the transistor region AR_T and the plurality of multifunctional stacks MST_CA, MST_CB, and MST_CC over the capacitor region AR_C may be separated from each other, and may have the same or different sizes. According to an embodiment, the plurality of multifunctional stacks MST_T over the transistor region AR_T may have the same size, and the plurality of multifunctional stacks MST_CA, MST_CB, and MST_CC over the capacitor region AR_C may be divided into a first group MST_CA, a second group MST_CB, and a third group MST_CC. The first group MST_CA, the second group MST_CB, and the third group MST_CC may have different sizes. However, embodiments of the present disclosure are not limited thereto. The plurality of multifunctional stacks MST_T over the transistor region AR_T and the plurality of multifunctional stacks MST_CA, MST_CB, and MST_CC over the capacitor region AR_C may be designed to have various sizes. Each of the plurality of multifunctional stacks MST_T over the transistor region AR_T and the plurality of multifunctional stacks MST_CA, MST_CB, and MST_CC over the capacitor region AR_C may include a plurality of grooves which are filled with a plurality of test patterns as described above with reference to FIG. 5A.

Figure 7:
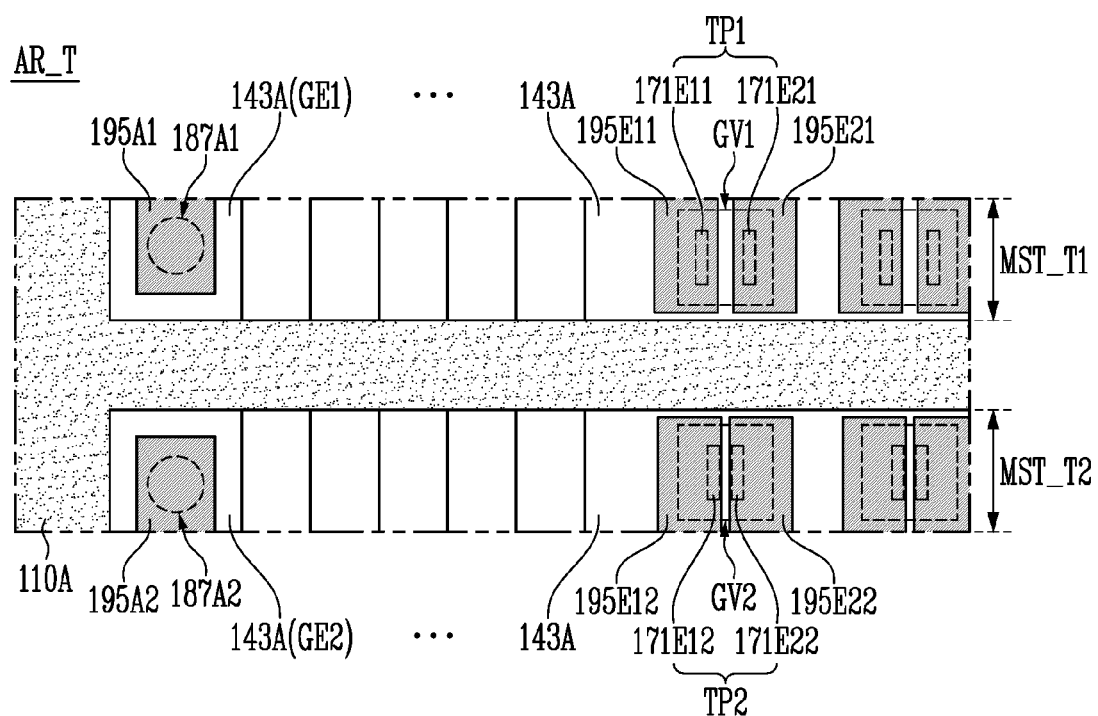
FIG. 7 is a plan view illustrating a test pattern array in a transistor region according to an embodiment of the present disclosure.

FIG. 7 is a plan view illustrating a test pattern array in a transistor region according to an embodiment of the present disclosure.

Referring to FIG. 7, a first multifunctional stack MST_T1 and a second multifunctional stack MST_T2 may be arranged to overlap the transistor region AR_T of the first doped semiconductor layer 110A. The first multifunctional stack MST_T1 and the second multifunctional stack MST_T2 may be adjacent to each other at a predetermined distance. Each of the first multifunctional stack MST_T1 and the second multifunctional stack MST_T2 may have the same cross-sectional structure as the multifunctional stack MST as shown in FIG. 5A. For example, each of the first multifunctional stack MST_T1 and the second multifunctional stack MST_T2 may include a plurality of first conductive layers 143A as described above with reference to FIG. 5A. One of the first conductive layers 143A of the first multifunctional stack MST_T1 may be provided as a first gate electrode conductive layer GE1. One of the plurality of first conductive layers 143A of the second multifunctional stack MST_T2 may be provided as a second gate electrode conductive layer GE2. Hereinafter, a description of similar components to those shown in FIG. 5A will be omitted.

The first multifunctional stack MST_T1 may include a plurality of first grooves GV1. The second multifunctional stack MST_T2 may include a plurality of second grooves GV2. The first groove GV1 and the second groove GV2 may have the same or different areas in a plan view. Similarly to the third electrode conductive layer EL as shown in FIG. 5A, the first gate electrode conductive layer GE1 may extend between the first groove GV1 and the first doped semiconductor layer 110A. Similarly to the third electrode conductive layer EL as shown in FIG. 5A, the second gate electrode conductive layer GE2 may extend between the second groove GV2 and the first doped semiconductor layer 110A. The first gate electrode conductive layer GE1 and the second gate electrode conductive layer GE2 may be connected to a first gate wire 195A1 and a second gate wire 195A2 through a first contact plug 187A1 and a second contact plug 187A2, respectively.

A plurality of first test patterns TP1 may be arranged in the plurality of first grooves GV1. A plurality of second test patterns TP2 may be arranged in the plurality of second grooves GV2. The plurality of first test patterns TP1 may include a plurality of first electrode pairs. The plurality of first electrode pairs may include a plurality of first source electrodes 171E11 and a plurality of first drain electrodes 171E21. The plurality of first source electrodes 171E11 may be individually connected to a plurality of first source wires 195E11. The plurality of first drain electrodes 171E21 may be individually connected to a plurality of first drain wires 195E21. Similarly to the plurality of first test patterns TP1, the plurality of second test patterns TP2 may include a plurality of second electrode pairs which include a plurality of second source electrodes 171E12 and a plurality of second drain electrodes 171E22. Similarly to the plurality of first source electrodes 171E11 and the plurality of first drain electrodes 171E21, the plurality of second source electrodes 171E12 and the plurality of second drain electrodes 171E22 may be individually connected to a plurality of second source wires 195E12 and a plurality of second drain wires 195E22.

Figure 8A:
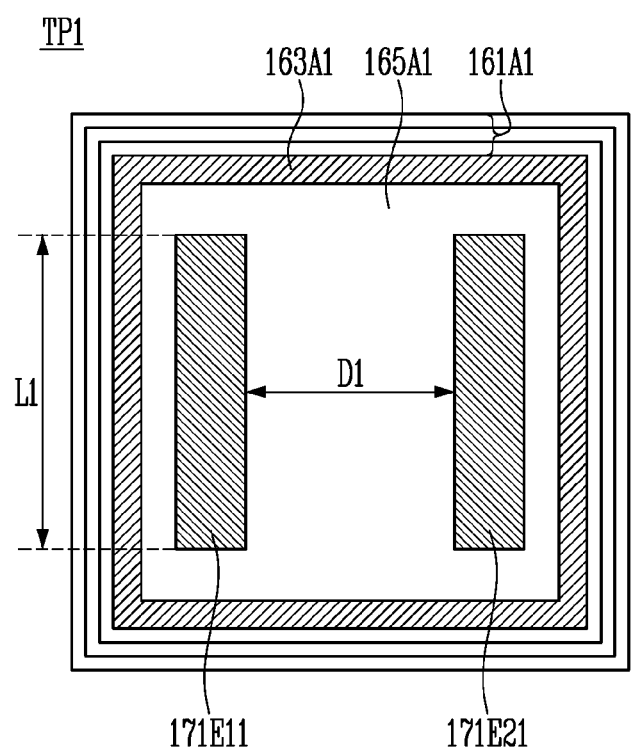
FIGS. 8A and 8B are plan views illustrating a first test pattern and a second test pattern in a transistor region according to an embodiment of the present disclosure.
Figure 8B:
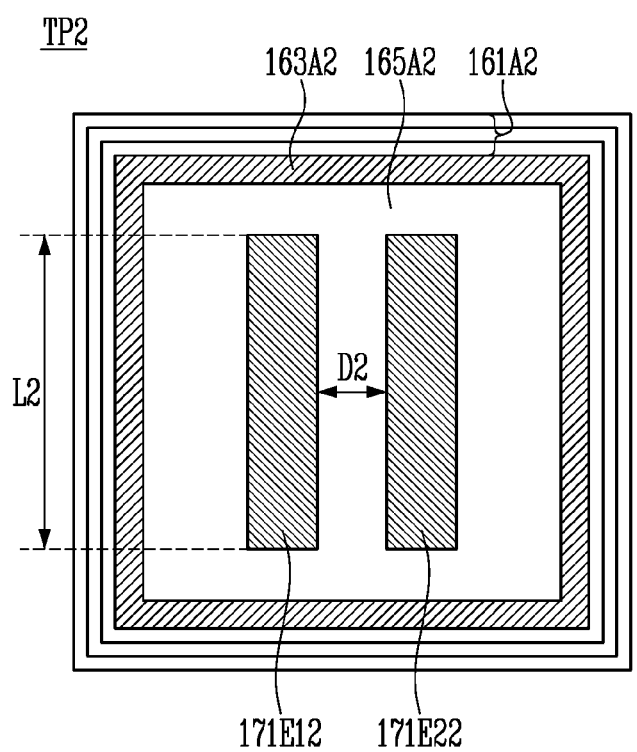

FIGS. 8A and 8B are plan views illustrating the first test pattern TP1 and the second test pattern TP2 over the transistor region according to an embodiment of the present disclosure.

The first test pattern TP1 as shown in FIG. 8A may correspond to the first test pattern TP1 as shown in FIG. 7.

Referring to FIG. 8A, the first test pattern TP1 may include a pair of the first source electrode 171E11 and the first drain electrode 171E21, a first filling insulating layer 165A1 corresponding thereto, a first liner semiconductor layer 163A1 corresponding thereto, and a first liner insulating layer 161A1 corresponding thereto. Similarly, as the first electrode 171E1 and the second electrode 171E2 shown in FIG. 5A, the pair of the first source electrode 171E11 and the first drain electrode 171E21 may extend in a first direction from the first liner semiconductor layer 163A1. Similarly, as the liner semiconductor layer 163A and the liner insulating layer 161A shown in FIG. 5A, the first liner semiconductor layer 163A1 and the first liner insulating layer 161A1 may extend along the bottom surface of the first groove defined by the first gate electrode conductive layer GE1 as shown in FIG. 7.

The second test pattern TP2 as shown in FIG. 8B may correspond to the second test pattern TP2 as shown in FIG. 7.

Referring to FIG. 8B, the second test pattern TP2 may include a pair of the second source electrode 171E12 and the second drain electrode 171E22, a second filling insulating layer 165A2 corresponding thereto, a second liner semiconductor layer 163A2 corresponding thereto, and a second liner insulating layer 161A2 corresponding thereto. Similarly, as the first electrode 171E1 and the second electrode 171E2 shown in FIG. 5A, the pair of the second source electrode 171E12 and the second drain electrode 171E22 may extend in the first direction from the second liner semiconductor layer 163A2. Similarly, as the liner semiconductor layer 163A and the liner insulating layer 161A shown in FIG. 5A, the second liner semiconductor layer 163A2 and the second liner insulating layer 161A2 may extend along the bottom surface of the second groove defined by the second gate electrode conductive layer GE2 as shown in FIG. 7.

Referring to FIGS. 8A and 8B, a length L1 of each of the first source electrode 171E11 and the first drain electrode 171E21, a length L2 of each of the second source electrode 171E12 and the second drain electrode 171E22, a distance D1 between the first source electrode 171E11 and the first drain electrode 171E21, and a distance D2 between the second source electrode 171E12 and the second drain electrode 171E22 may be designed to have various values. According to an embodiment, the length L1 of each of the first source electrode 171E11 and the first drain electrode 171E21 may be the same as or different from the length L2 of each of the second source electrode 171E12 and the second drain electrode 171E22. According to an embodiment, the distance D1 between the first source electrode 171E11 and the first drain electrode 171E21 may be the same as or different from the distance D2 between the second source electrode 171E12 and the second drain electrode 171E22. The length L1 of each of the first source electrode 171E11 and the first drain electrode 171E21 may define a channel width of a first transistor corresponding to the first test pattern TP1. The distance D1 between the first source electrode 171E11 and the first drain electrode 171E21 may define a channel length of the first transistor. The length L2 of each of the second source electrode 171E12 and the second drain electrode 171E22 may define a channel width of a second transistor corresponding to the second test pattern TP2. The distance D2 between the second source electrode 171E12 and the second drain electrode 171E22 may define a channel length of the second transistor.

Transistors having various structures may be formed by the first test pattern TP1, the second test pattern TP2, the first gate electrode conductive layer GE1, and the second gate electrode conductive layer GE2 as described above with reference to FIGS. 7, 8A, and 8B. Each of the first liner semiconductor layer 163A1 and the second liner semiconductor layer 163A2 may be provided as a channel layer of a transistor corresponding thereto. According to an embodiment of the present disclosure, by changing design conditions of the first test pattern TP1 and the second test pattern TP2, transistors with a variety of channel lengths and channel widths may be provided. Accordingly, in various embodiments, data about memory cell under various design conditions may be obtained through the first test pattern TP1 and the second test pattern TP2.

Figure 9:
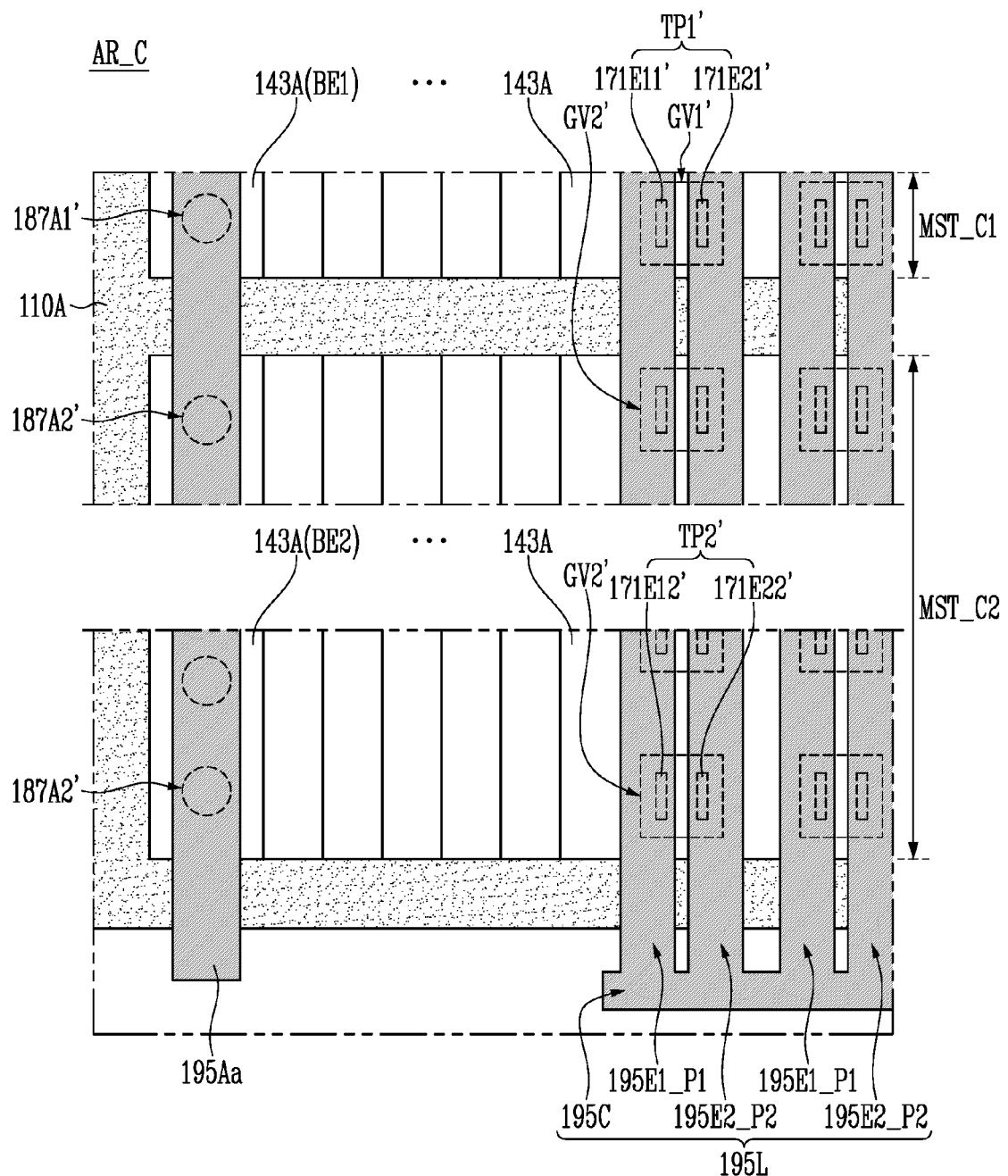
FIG. 9 is a plan view illustrating a test pattern array in a capacitor region according to an embodiment of the present disclosure.

FIG. 9 is a plan view illustrating a test pattern array over the capacitor region AR_C according to an embodiment of the present disclosure.

Referring to FIG. 9, a first multifunctional stack MST_C1 and a second multifunctional stack MST_C2 may be arranged to overlap the capacitor region AR_C of the first doped semiconductor layer 110A. The first multifunctional stack MST_C1 and the second multifunctional stack MST_C2 may be adjacent to each other at a predetermined distance. Each of the first multifunctional stack MST_C1 and the second multifunctional stack MST_C2 may have the same cross-sectional structure as the multifunctional stack MST as shown in FIG. 5A. For example, each of the first multifunctional stack MST_C1 and the second multifunctional stack MST_C2 may include a plurality of first conductive layers 143A as described above with reference to FIG. 5A. One of the first conductive layers 143A of the first multifunctional stack MST_C1 may be provided as a first lower electrode conductive layer BE1. One of the plurality of first conductive layers 143A of the second multifunctional stack MST_C2 may be provided as a second lower electrode conductive layer BE2. Hereinafter, a description of similar components to those shown in FIG. 5A will be omitted.

As described above with reference to FIG. 7, the first multifunctional stack MST_C1 may include a plurality of first grooves GV1' which are filled with a plurality of first test patterns TP1', and the second multifunctional stack MST_C2 may include a plurality of second grooves GV2' which are filled with a plurality of second test patterns TP2'. The first lower electrode conductive layer BE1 may extend between the first groove GV1' and the first doped semiconductor layer 110A, similarly to the third electrode conductive layer EL as shown in FIG. 5A. The second lower electrode conductive layer BE2 may extend between the second groove GV2' and the first doped semiconductor layer 110A, similarly to the third electrode conductive layer EL as shown in FIG. 5A.

The first lower electrode conductive layer BE1 and the second lower electrode conductive layer BE2 may be connected in common to a first capacitor wire 195Aa through a first contact plug 187A1' and a second contact plug 187A2' corresponding thereto.

Each of the plurality of first test patterns TP1' and the plurality of second test patterns TP2' may have the same cross-sectional structure as the test pattern TP as shown in FIG. 5A. Though not shown in FIG. 9, each of the plurality of first test patterns TP1' and the second test patterns TP2' may include a liner insulating layer, a liner semiconductor layer, and a filling insulating layer corresponding thereto as described above with reference to FIG. 5A.

The plurality of first test patterns TP1' may include a plurality of first electrodes 171E11' and a plurality of second electrodes 171E21' of a plurality of first electrode pairs. The plurality of second test patterns TP2' may include a plurality of first electrodes 171E12' and a plurality of second electrodes 171E22' of a plurality of second electrode pairs. As described above with reference to FIG. 5A, a first electrode 171E11' and a second electrode 171E21' of each of the first electrode pairs may extend from a liner semiconductor layer corresponding thereto in the first direction to pass through a filling insulating layer corresponding thereto. As described above with reference to FIG. 5A, a first electrode 171E12' and a second electrode 171E22' of each of the second electrode pairs may extend from a liner semiconductor layer corresponding thereto in the first direction to pass through a filling insulating layer corresponding thereto.

The plurality of first electrodes 171E11' and the plurality of second electrodes 171E21' of the first electrode pairs may be connected in common to a second capacitor wire 195L. In addition, the plurality of first electrodes 171E12' and the plurality of second electrodes 171E22' of the plurality of second electrode pairs may be connected in common to the second capacitor wire 195L. According to an embodiment, the second capacitor wire 195L may include a first line pattern portion 195E1_P1, a second line pattern portion 195E2_P2, and a connection pattern portion 195C which connects the first line pattern portion 195E1_P1 and the second line pattern portion 195E2_P2. The first line pattern portion 195E1_P1 may be connected to the first electrode 171E11' of the first electrode pair and the first electrode 171E12' of the second electrode pair which are arranged next to each other. The second line pattern portion 195E2_P2 may be connected to the second electrode 171E21' of the first electrode pair and the second electrode 171E22' of the second electrode pair which are arranged next to each other.

The first capacitor wire 195Aa and the second capacitor wire 195L are not limited to those shown in FIG. 9. For example, the first capacitor wire connected to the first lower electrode conductive layer BE1 and the first capacitor wire connected to the second lower electrode conductive layer BE2 may be separated from each other. A second capacitor wire connected to the plurality of first electrodes 171E11' and the plurality of second electrodes 171E21' of the first electrode pairs and a second capacitor wire connected to a plurality of first electrodes 171E12' and the plurality of second electrodes 171E22' of the second electrode pairs may be separated from each other. The first capacitor wire 195Aa and the second capacitor wire 195L may have various designs to provide various capacitances.

According to the embodiments described with reference to FIG. 9, various capacitances may be provided.

FIGS. 10A, 10B, 11A, 11B, 12A, 12B, 13A, 13B, 14, 15, 16A, 16B, 17A, and 17B are cross-sectional diagrams illustrating a method of manufacturing a semiconductor memory device according to an embodiment of the present disclosure. FIGS. 10A, 11A, 12A, 13A, 15, 16A, and 17A are cross-sectional diagrams illustrating a structure which is formed on a portion of the scribe region SR or a portion of the chip region CR of the substrate 101 which is provided as the test region as shown in FIG. 1. FIGS. 10B, 11B, 12B, 13B, 14, 16B, and 17B are cross-sectional diagrams illustrating a structure which is formed on another portion of the chip region CR of the substrate 101 as shown in FIG. 1.

Figure 10A:
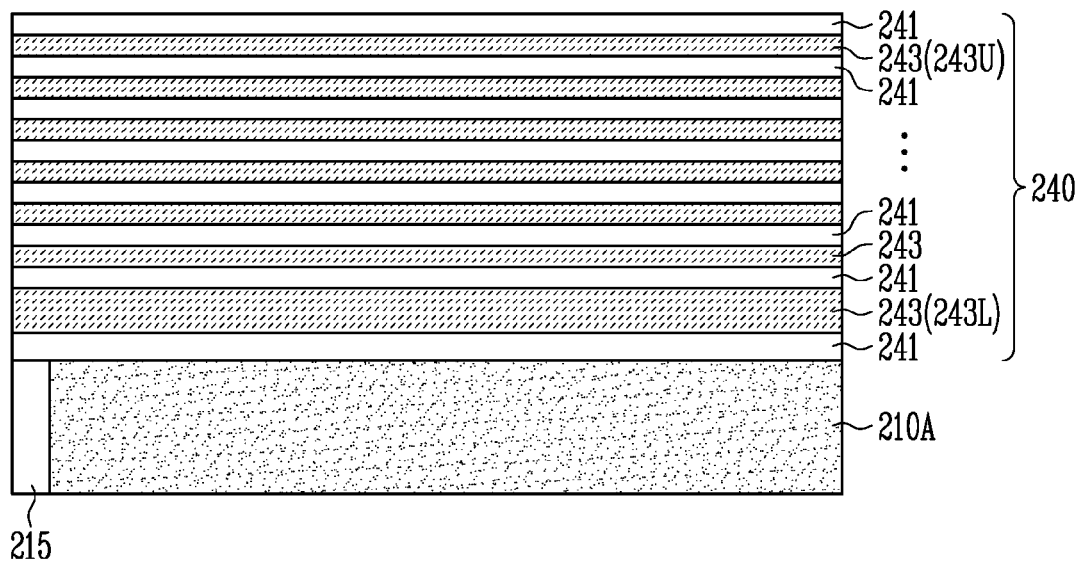
FIGS. 10A, 10B, 11A, 11B, 12A, 12B, 13A, 13B, 14, 15, 16A, 16B, 17A, and 17B are cross-sectional diagrams illustrating a method of manufacturing a semiconductor memory device according to an embodiment of the present disclosure.
Figure 10B:
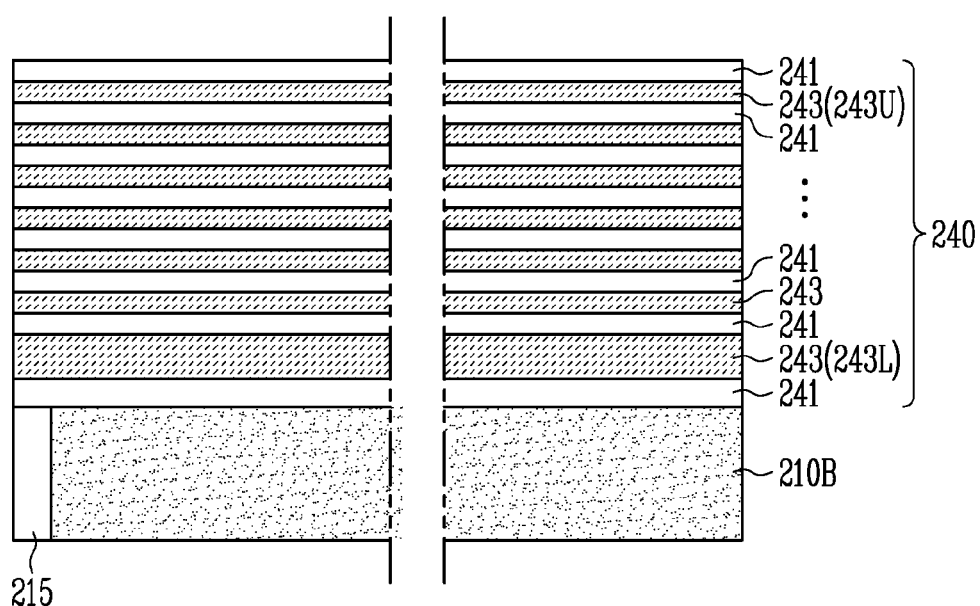

Referring to FIGS. 10A and 10B, a lower structure may be formed. The lower structure may be partitioned by a lower insulating layer 215 and may include a first doped semiconductor layer 210A and a second doped semiconductor layer 210B which are spaced apart from each other. The first doped semiconductor layer 210A and the second doped semiconductor layer 210B may include the same materials as the first doped semiconductor layer 110A and the second doped semiconductor layer 110B as described above with reference to FIG. 2.

Subsequently, a preliminary stacked structure 240 may be formed by alternately stacking a plurality of interlayer insulating layers 241 and a plurality of conductive layers 243 with each other on the lower structure. The plurality of interlayer insulating layers 241 may include a silicon oxide layer. The plurality of conductive layers 243 may include at least one of a doped semiconductor layer, metal, a conductive metal nitride layer, and a transition metal.

Figure 11A:
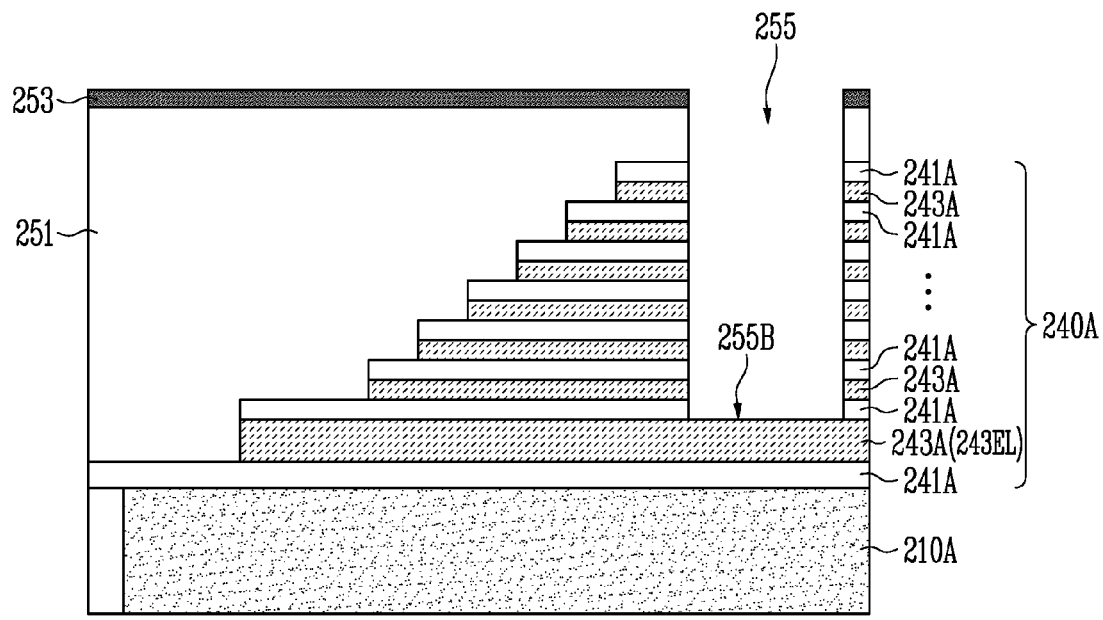
Figure 11B:
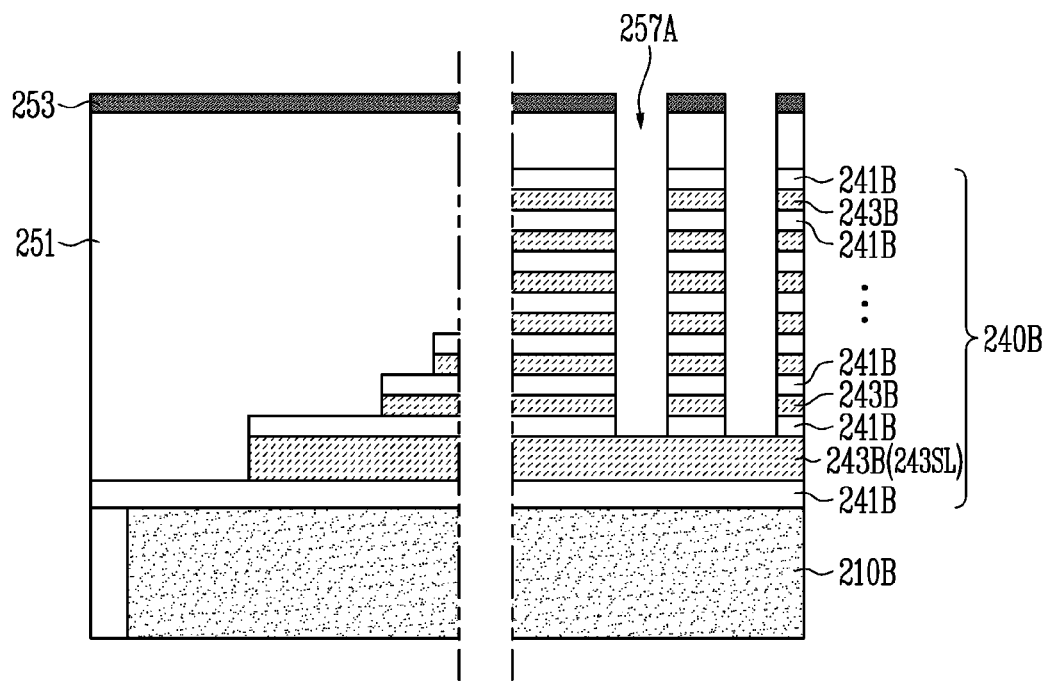

Referring to FIGS. 11A and 11B, by etching the preliminary stacked structure 240 as shown in FIGS. 10A and 10B, the preliminary stacked structure 240 may be separated into a multifunctional stack 240A and a gate stack 240B. More specifically, the plurality of interlayer insulating layers 241 as shown in FIGS. 10A and 10B may be separated into a plurality of first interlayer insulating layers 241A of the multifunctional stack 240A and a plurality of second interlayer insulating layers 241B of the gate stack 240B. The plurality of conductive layers 243 as shown in FIGS. 10A and 10B may be separated into a plurality of first conductive layers 243A of the multifunctional stack 240A and a plurality of second conductive layers 243B of the gate stack 240B.

According to an embodiment, the plurality of second conductive layers 243B may be provided as gate electrodes of a NAND flash memory cell array. A lowermost second conductive layer among the plurality of second conductive layers 243B may serve as a source select line 243SL. Upper second conductive layers over the source select line 243SL may serve as word lines and a drain select line.

One of the first conductive layers 243A may serve as an electrode layer 243EL. According to an embodiment, a lowermost first conductive layer among the plurality of first conductive layers 243A may be provided as the electrode layer 243EL. However, the embodiment of the present disclosure is not limited thereto. At least one of the upper first conductive layers over the lowermost first conductive layer may be provided as an electrode layer.

The multifunctional stack 240A may overlap the first doped semiconductor layer 210A. The first doped semiconductor layer 210A may overlap the multifunctional stack 240A separated into a plurality of structures. The separated structures and sizes of the multifunctional stack 240A may vary. In addition, as described above with reference to FIG. 6, the separated structures formed of the multifunctional stack 240A may be arranged to overlap the capacitor region and the transistor region. The gate stack 240B may overlap the second doped semiconductor layer 210B.

A stepped structure may be formed on each of the multifunctional stack 240A and the gate stack 240B. The process of forming the stepped structure on each of the multifunctional stack 240A and the gate stack 240B may include a process of forming a mask pattern (not shown) on each of the multifunctional stack 240A and the gate stack 240B and a process of repeating a trimming cycle for an electrode contact region of the multifunctional stack 240A and a gate contact region of the gate stack 240B. Each trimming cycle may include a process of etching the plurality of interlayer insulating layers 241 and the plurality of conductive layers 243 by using a mask pattern as an etch barrier and a process of reducing a size of the mask pattern.

After forming the stepped structure, the mask pattern may be removed and a first insulating layer 251 may be formed. The first insulating layer 251 may cover the stepped structure of the multifunctional stack 240A and the stepped structure of the gate stack 240B. The surface of the first insulating layer 251 may be planarized. A second insulating layer 253 may be formed on the first insulating layer 251. The second insulating layer 253 may include a material having an etch selectivity with respect to the first insulating layer 251. According to an embodiment, the first insulating layer 251 may include a silicon oxide layer, and the second insulating layer 253 may include a silicon nitride layer.

A groove 255 may be formed in the multifunctional stack 240A. The groove 255 may be deep so as not to penetrate the electrode layer 243EL. A bottom surface 255B of the groove 255 may extend along the electrode layer 243EL. The groove 255 may be formed while a first vertical hole 257A is formed in the gate stack 240B. In other words, the groove 255 and the first vertical hole 257A may be formed at the same time.

The processes of forming the groove 255 and the first vertical hole 257A may include a process of forming a first mask layer (not shown) including openings which define the groove 255 and the first vertical hole 257A and a process of etching the second insulating layer 253, the first insulating layer 251, the multifunctional stack 240A, and the gate stack 240B using the first mask layer as an etch barrier. The etch process may be performed to expose the electrode layer 243EL of the multifunctional stack 240A. The bottom surface of the first vertical hole 257A may be defined by the second conductive layer 243B which is arranged at the same level as the electrode layer 243EL. According to an embodiment, the bottom surface of the first vertical hole 257A may be defined by the upper surface of the source select line 243SL.

Figure 12A:
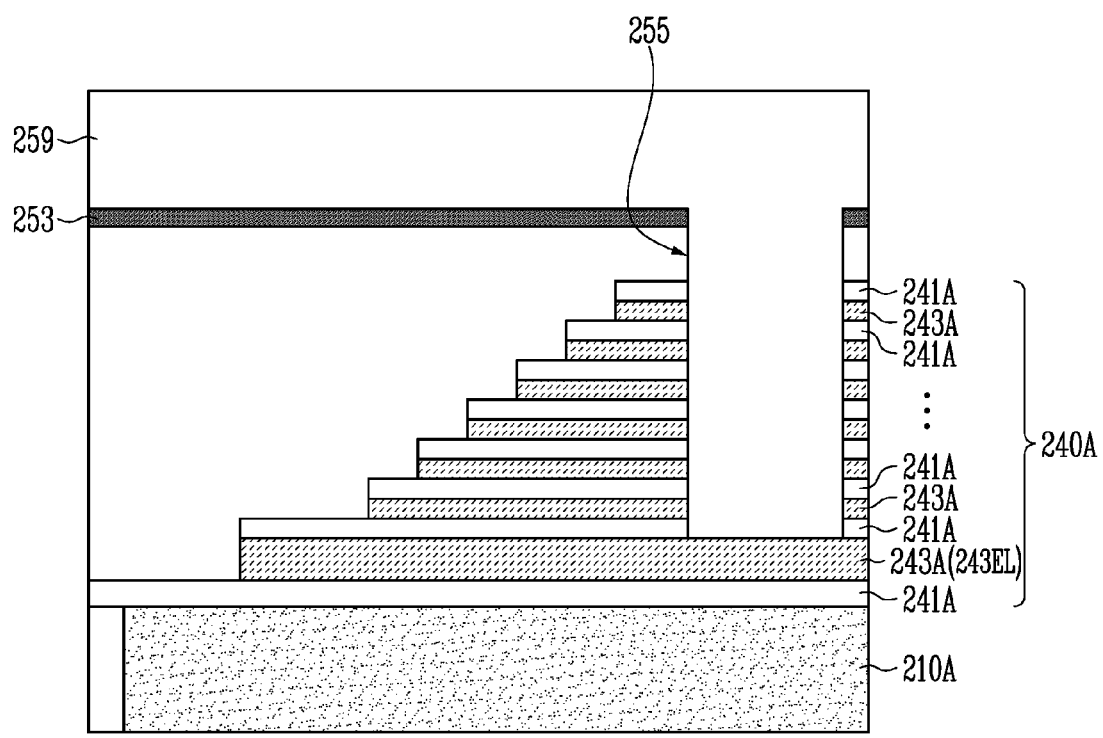
Figure 12B:
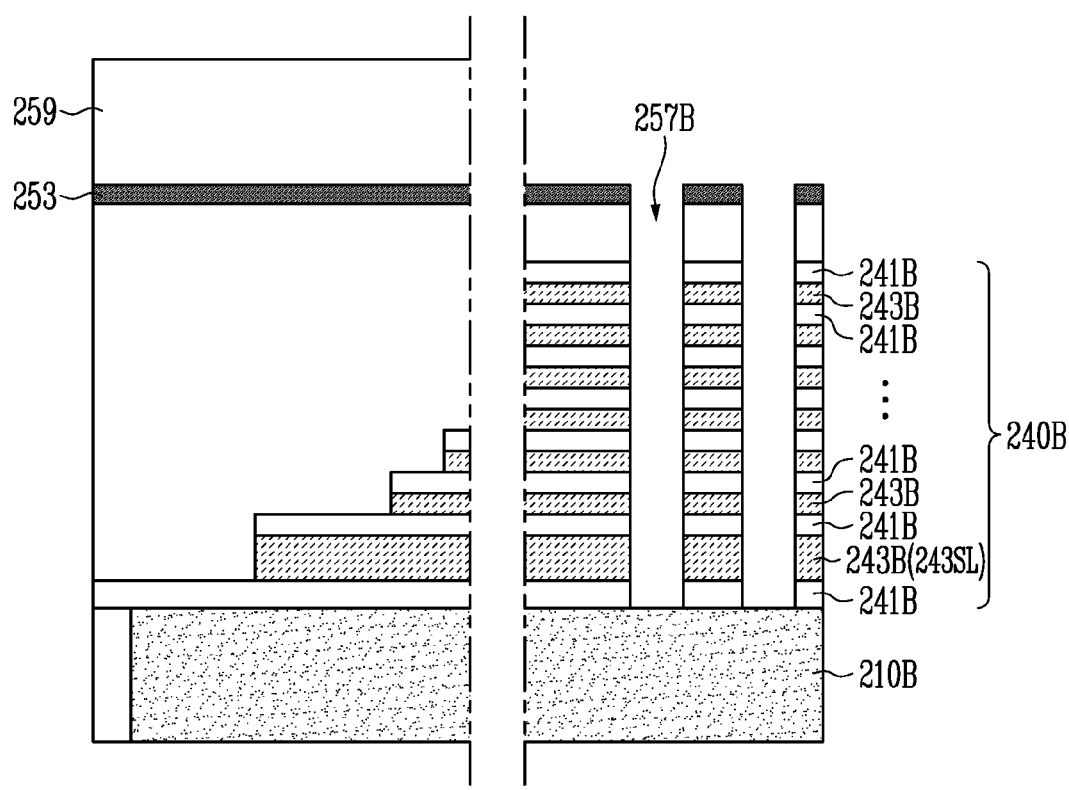

Referring to FIGS. 12A and 12B, a second mask layer 259 which fills the groove 255 and opens the first vertical hole 257A as shown in FIG. 11B may be formed. The second mask layer 259 may be formed on the first mask layer, or may be formed after the first mask layer is removed. Subsequently, a portion of the gate stack 240B may be etched by an etch process using the second mask layer 259 as an etch barrier. The portion of the gate stack being etched by the etch process may refer to a portion which is exposed through the bottom surface of the first vertical hole 257A as shown in FIG. 11B.

By the above-described etch process, a second vertical hole 257B which has a greater depth than the groove 255 may be formed. The plurality of second interlayer insulating layers 241B and the plurality of second conductive layers 243B of the gate stack 240B may be penetrated by the second vertical hole 257B, and the second doped semiconductor layer 210B may be exposed by the second vertical hole 257B. Thereafter, the second mask layer 259 may be removed.

Figure 13A:
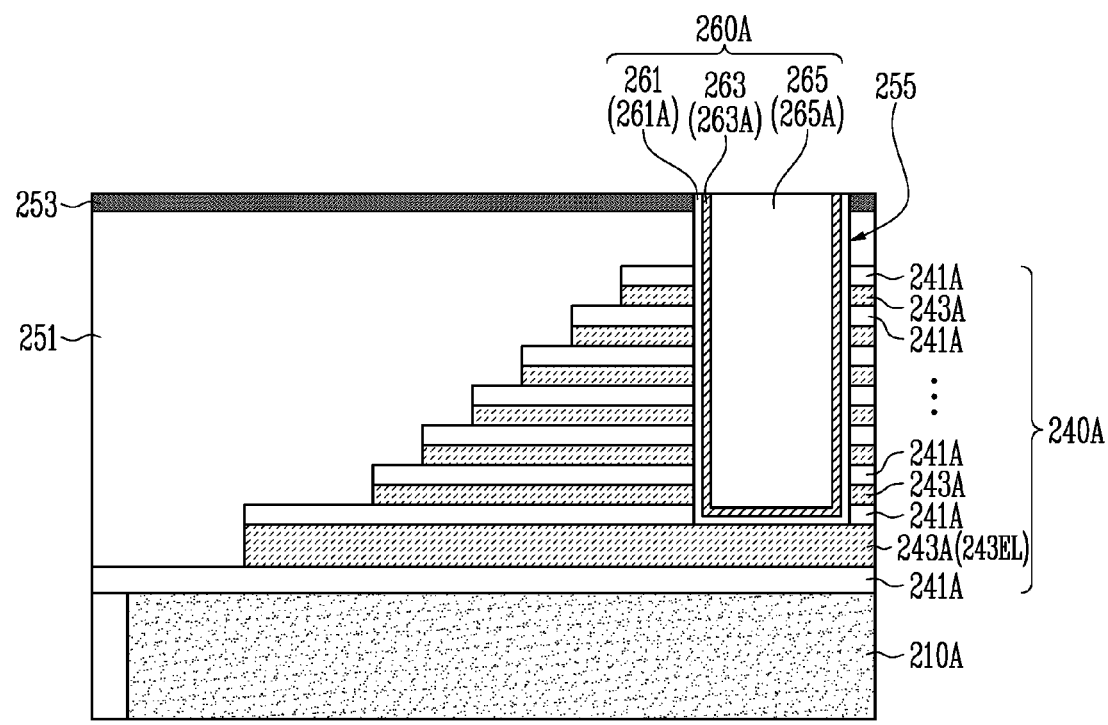
Figure 13B:
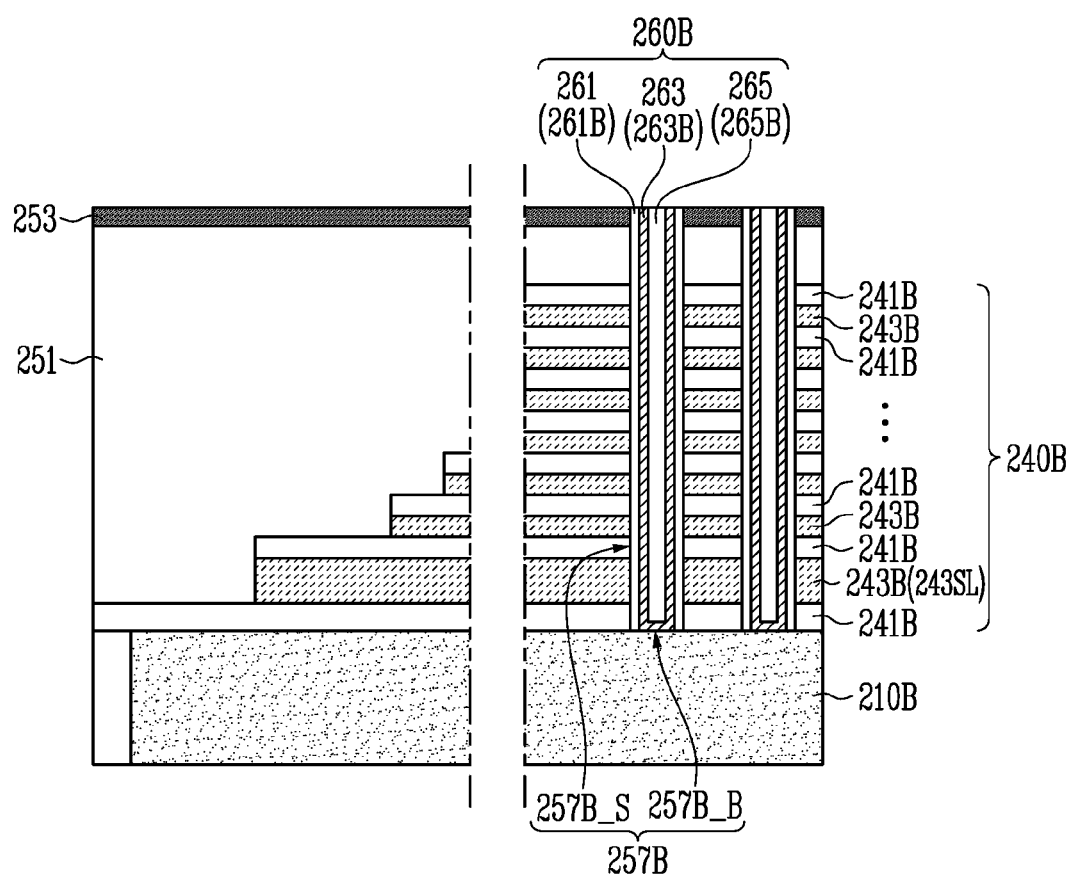

Referring to FIGS. 13A and 13B, a preliminary test pattern 260A may be formed in the groove 255. The preliminary test pattern 260A may be provided by a process of forming a preliminary cell plug 260B in the second vertical hole 257B.

According to an embodiment, the processes of forming the preliminary test pattern 260A and the preliminary cell plug 260B may include a process of forming a preliminary memory layer 261 on the surface of the groove 255 and the surface of the second vertical hole 257B, a process of removing a portion of the preliminary memory layer 261 from a bottom surface 2576_6 of the second vertical hole 257B to expose the second doped semiconductor layer 210B, forming a semiconductor layer 263 on the preliminary memory layer 261, a process of filling a central region of the groove 255 opened by the semiconductor layer 263 and a central region of the second vertical hole 257B with an insulating layer 265, and a process of performing a planarizing process to expose the second insulating layer 253.

The preliminary memory layer 261 may include a data storage layer such as a floating gate layer, an insulating layer including conductive nanodots, a charge trap layer, a ferroelectric layer, or a phase change layer. According to an embodiment, the preliminary memory layer 261 may include the blocking insulating layer BI, the charge trap layer CTL, and the tunnel insulating layer TI as shown in FIGS. 4A and 4B. The semiconductor layer 263 may include a semiconductor material such as silicon, germanium, or a combination thereof.

Before the portion of the preliminary memory layer 261 is removed, a mask layer (not shown) may be formed to protect a side portion 257B_S of the second vertical hole 257B and a portion of the preliminary memory layer 261 on the surface of the groove 255. The mask layer may be removed before the semiconductor layer 263 is formed. The semiconductor layer 263 may be formed after the second doped semiconductor layer 210B is exposed. Thus, the semiconductor layer 263 may be connected to the second doped semiconductor layer 210B.

By the planarizing process, the preliminary memory layer 261 may be separated into a liner insulating layer 261A on the surface of the groove 255 and a memory layer 261B on the side portion 257B_S of the second vertical hole 257B, the semiconductor layer 263 may be separated into a liner semiconductor layer 263A on the liner insulating layer 261A and a vertical semiconductor layer 263B on the memory layer 261B, and the insulating layer 265 may be separated into a filling insulating layer 265A in the groove 255 and a core insulating layer 265B in the second vertical hole 257B.

Figure 14:
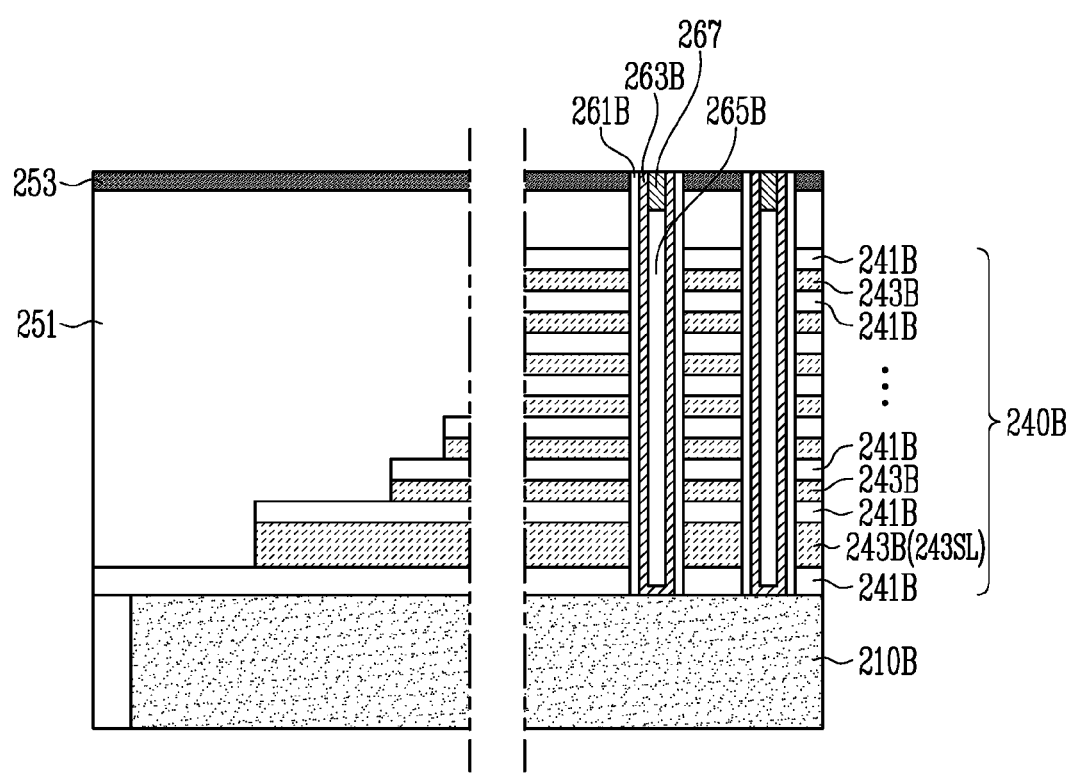

Referring to FIG. 14, a portion of the core insulating layer 265B may be etched and a region from which the core insulating layer 265B is removed may be filled with a conductive capping pattern 267. The conductive capping pattern 267 may include a semiconductor material doped with impurities. The impurities in the conductive capping pattern 267 may be dispersed into the vertical semiconductor layer 263B adjacent to the conductive capping pattern 267.

Figure 15:
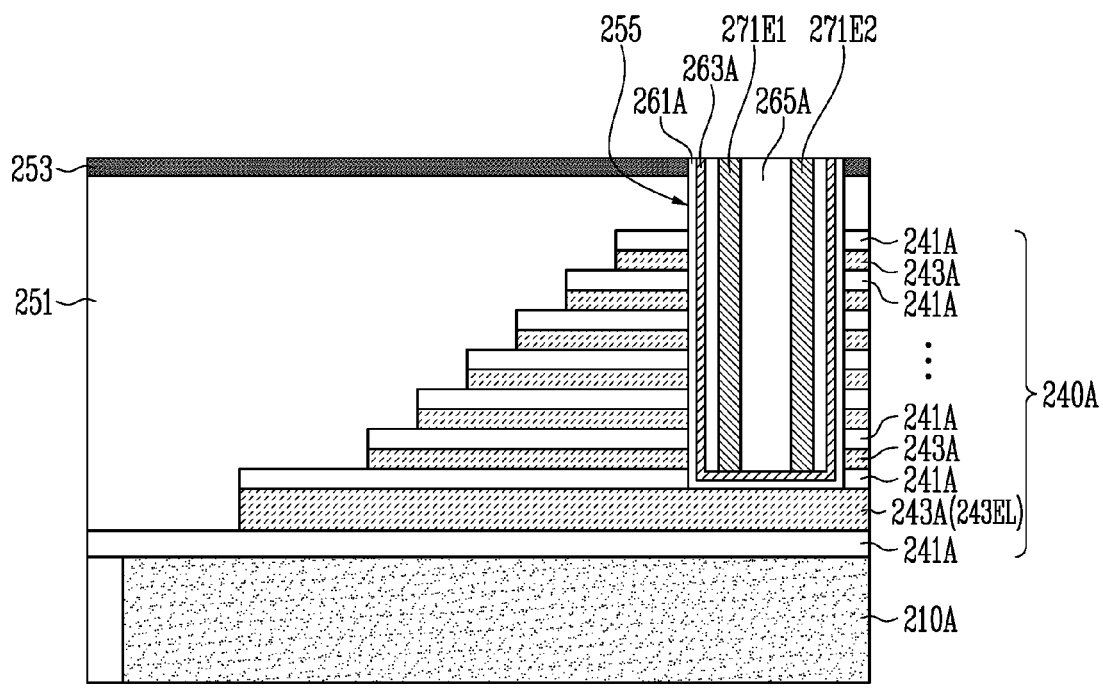

Referring to FIG. 15, a first electrode 271E1 and a second electrode 271E2 may be formed in the groove 255. The first electrode 271E1 and the second electrode 271E2 may pass through the filling insulating layer 265A and be connected to the liner semiconductor layer 263A. The first electrode 271E1 and the second electrode 271E2 may include a doped semiconductor material.

Figure 16A:
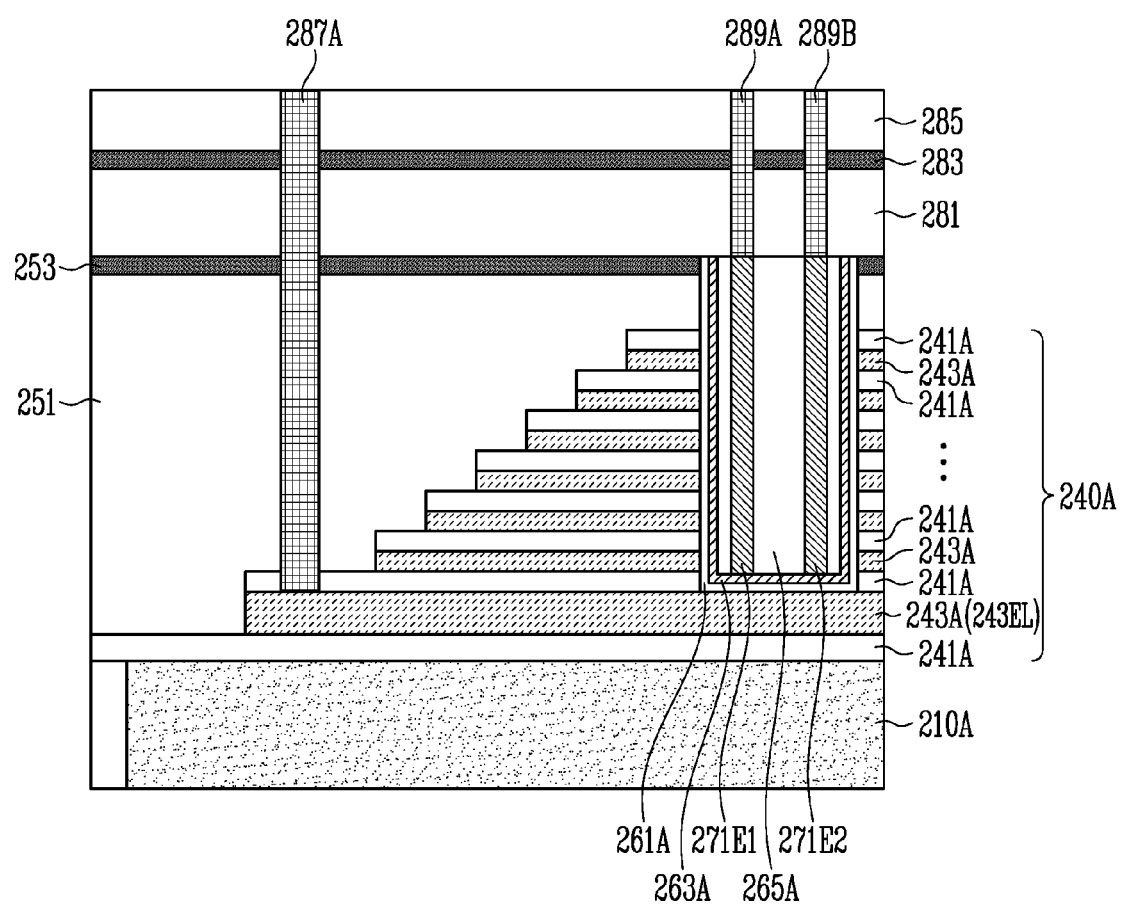
Figure 16B:
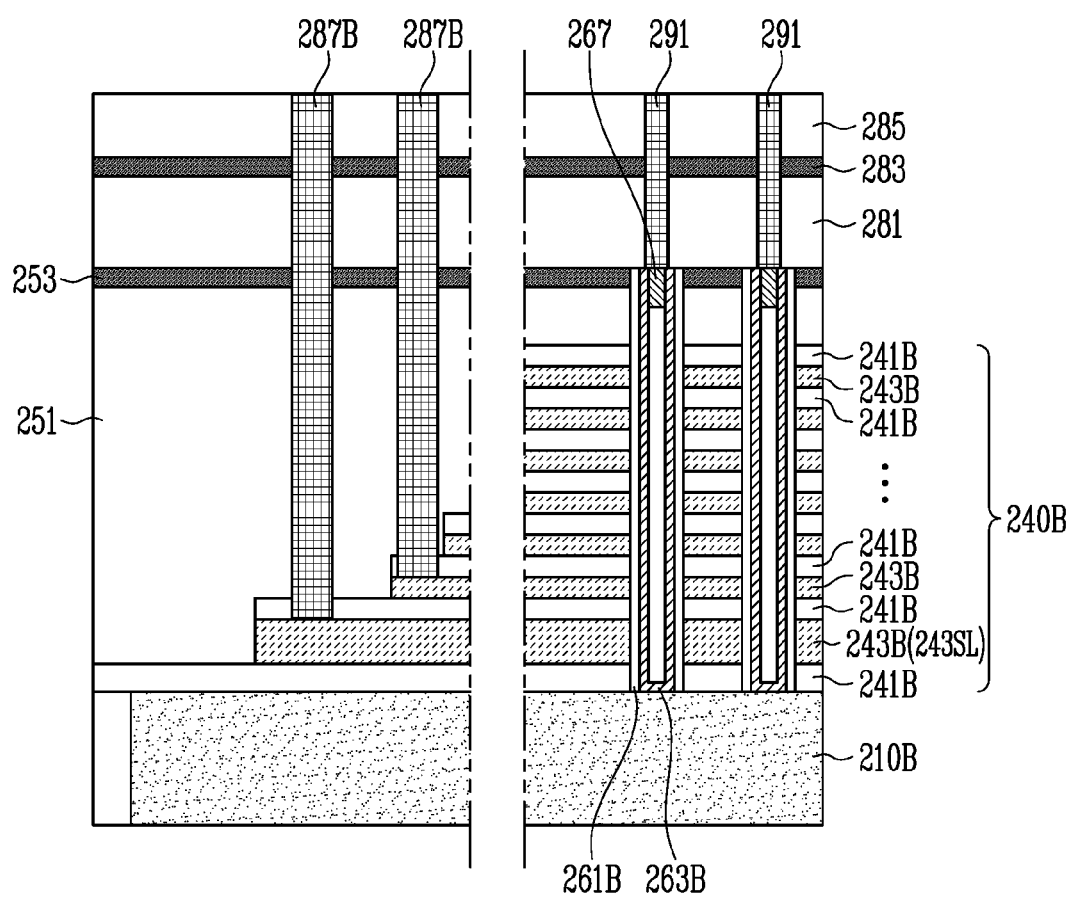

Referring to FIGS. 16A and 16B, at least one insulating layer may be formed on the second insulating layer 253. According to an embodiment, a third insulating layer 281, a fourth insulating layer 283, and a fifth insulating layer 285 may be formed on the second insulating layer 253. The fourth insulating layer 283 may include a material having an etch selectivity with respect to the third insulating layer 281 and the fifth insulating layer 285. According to an embodiment, the third insulating layer 281 and the fifth insulating layer 285 may include a silicon oxide layer, and the fourth insulating layer 283 may include a silicon nitride layer.

Subsequently, contact groups 287A, 289A, 289B, 287B, and 291 may be formed. The contact groups 287A, 289A, 289B, 287B, and 291 may include a contact plug 287A which is connected to the electrode layer 243EL, gate contact plugs 287B which are connected to the conductive layers 243B, respectively, a first upper contact plug 289A and a second upper contact plug 289B which are connected to the first electrode 271E1 and the second electrode 271E2, respectively, and a third upper contact plug 291 which is connected to the conductive capping pattern 267.

According to an embodiment, a process of forming the contact groups 287A, 289A, 289B, 287B, and 291 may include a process of forming contact holes having different depths through an etch process using a mask pattern (not shown), which open regions where the contact groups 287A, 289A, 289B, 287B, and 291 are formed, as an etch barrier, and a process of filling the contact holes with a conductive material. According to another embodiment, the process of forming the contact groups 287A, 289A, 289B, 287B, and 291 may include a process of forming the contact plug 287A and the gate contact plugs 287B and a process of forming a first upper contact plug 289A, a second upper contact plug 289B, and a third upper contact plug 291.

In addition to the above-described embodiments, the process of forming the third insulating layer 281, the fourth insulating layer 283, and the fifth insulating layer 285 and the process of forming the contact groups 287A, 289A, 289B, 287B, and 291 may be divided into unit processes in various schemes.

Figure 17A:
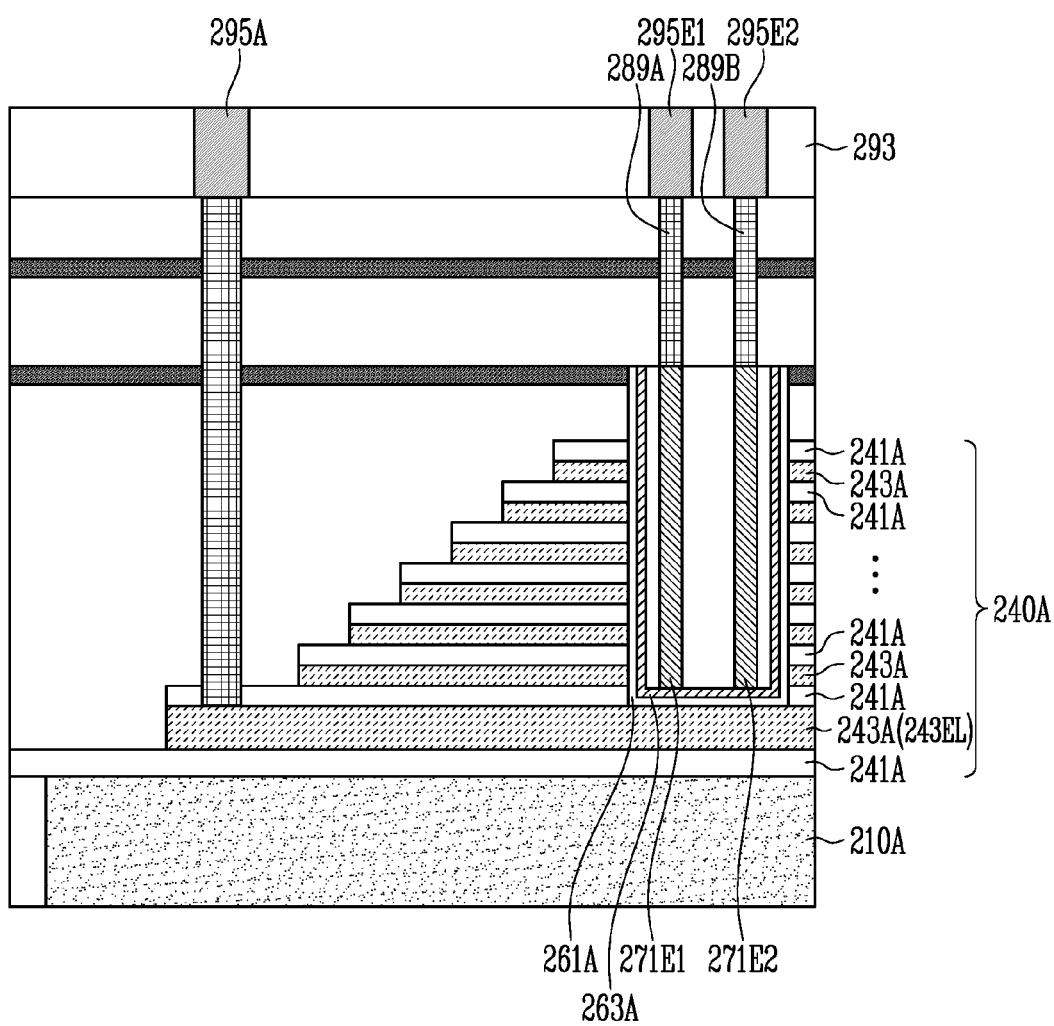
Figure 17B:
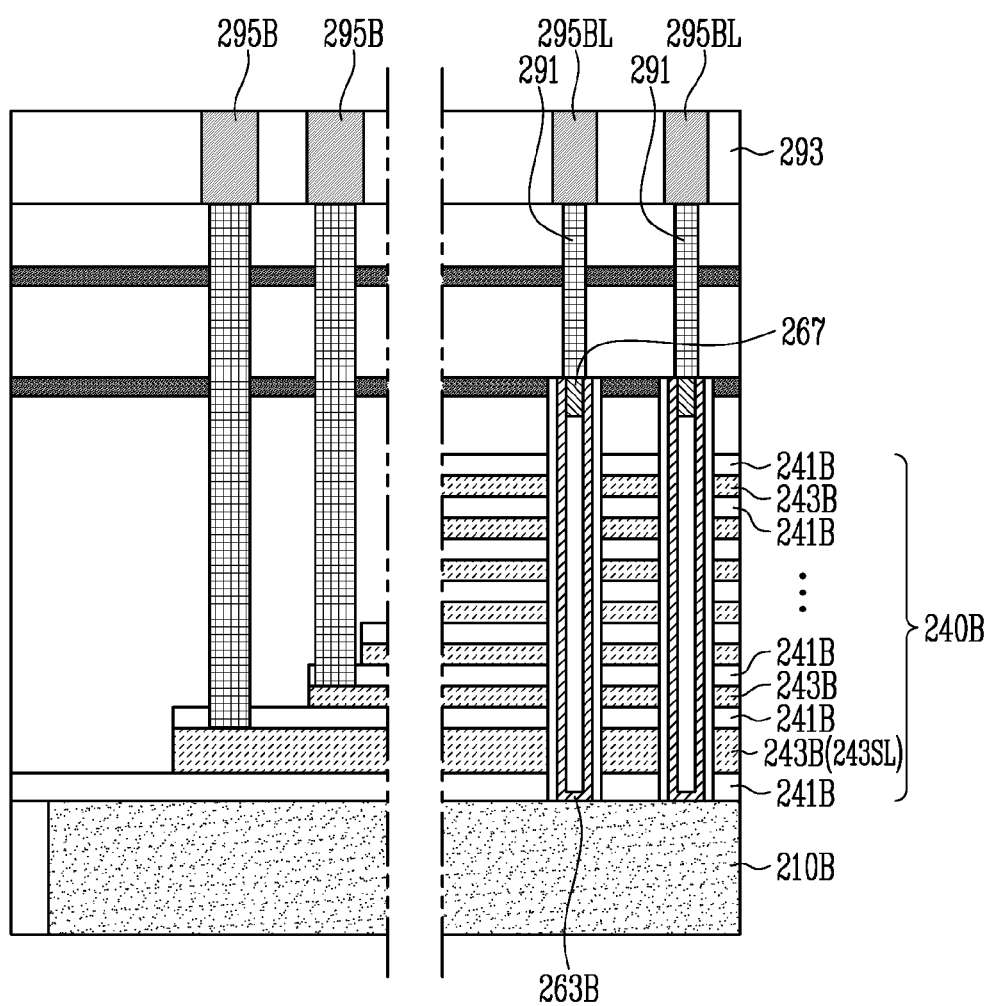

Referring to FIGS. 17A and 17B, a sixth insulating layer 293 may be formed on the fifth insulating layer 285 to cover the contact groups 287A, 289A, 289B, 287B, and 291. Wiring groups 295A, 295E1, 295E2, 295B, and 295BL may be formed to pass through the sixth insulating layer 293.

The wiring groups 295A, 295E1, 295E2, 295B, and 295BL may be connected to the contact groups 287A, 289A, 289B, 287B, and 291. The layout of the wiring groups 295A, 295E1, 295E2, 295B, and 295BL may vary as described above with reference to FIGS. 7 and 9.

The above-described manufacturing method is described based on the example in which the preliminary stacked structure 240 includes the plurality of interlayer insulating layers 241 and the plurality of conductive layers 243 stacked alternately with each other as shown in FIGS. 10A and 10B. However, embodiments of the present disclosure are not limited thereto. According to another embodiment, the preliminary stacked structure may include a plurality of interlayer insulating layers and a plurality of sacrificial layers which are stacked alternately with each other. The plurality of sacrificial layers may include a material having an etch selectivity with respect to the plurality of interlayer insulating layers. For example, the plurality of interlayer insulating layers may include a silicon oxide layer and the plurality of sacrificial layers may include a silicon nitride layer. The plurality of sacrificial layers may be replaced by a plurality of conductive layers through a replace process. The replace process may be performed using a slit for replacement after the processes as described above with reference to FIGS. 14 and 15 are performed.

Figure 18:
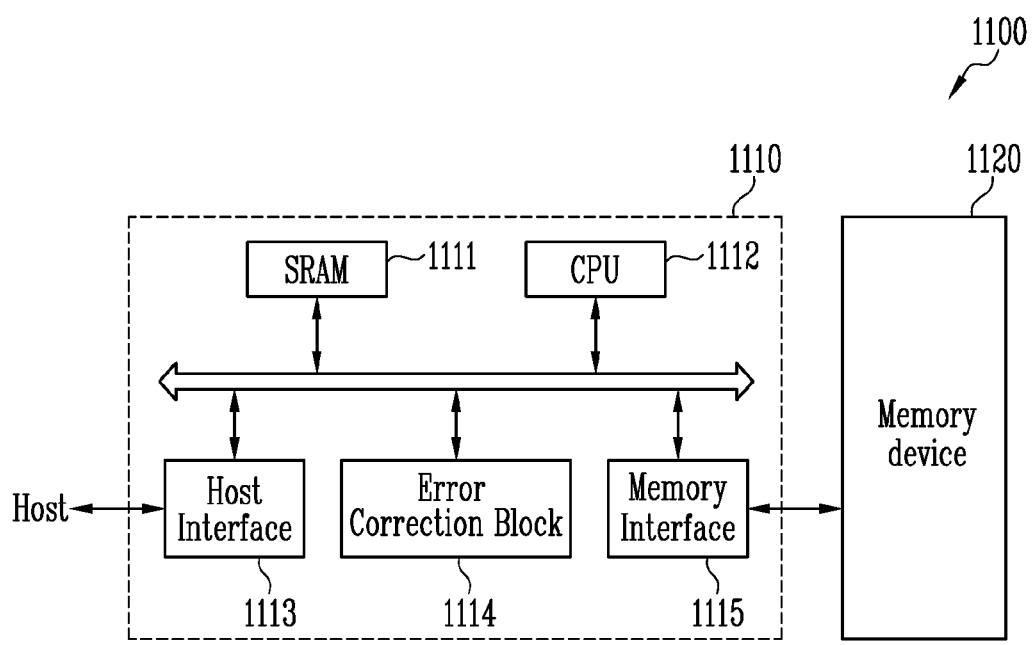
FIG. 18 is a block diagram illustrating the configuration of a memory system according to an embodiment of the present disclosure.

FIG. 18 is a block diagram illustrating a configuration of a memory system 1100 according to an embodiment of the present disclosure.

Referring to FIG. 18, the memory system 1100 includes a memory device 1120 and a memory controller 1110.

The memory controller 1110 may include a three-dimensional cell array structure and a test pattern in a multifunction stack. The multifunctional stack and the test pattern may have a similar structure to the three-dimensional memory cell array structure. More specifically, the multifunctional stack may include a plurality of interlayer insulating layers and a plurality of conductive layers stacked alternately with each other above a doped semiconductor layer, and may include a groove. Because the multifunctional stack is similar to a gate stack having a vertical hole in the three-dimensional cell array structure, the multifunctional stack may be formed at the same time as the gate stack. The test pattern may include a liner insulating layer on a bottom surface of the groove, a liner semiconductor layer on the liner insulating layer, and a first electrode and a second electrode spaced apart from each other in the groove. The test pattern may be formed by a process of forming a cell plug in the vertical hole.

The memory device 1120 may be a multi-chip package which includes a plurality of flash memory chips.

The memory controller 1110 may be configured to control the memory device 1120, and may include static random access memory (SRAM) 1111, a central processing unit (CPU) 1112, a host interface 1113, an error correction block 1114, and a memory interface 1115. The SRAM 1111 may serve as operation memory of the CPU 1112, the CPU 1112 may perform an overall control operation for data exchange of the memory controller 1110, and the host interface 1113 may include a data exchange protocol of a host connected to the memory system 1100. In addition, the error correction block 1114 may detect and correct errors included in data read from the memory device 1120, and the memory interface 1115 may perform interfacing with the memory device 1120. In addition, the memory controller 1110 may further include read only memory (ROM) that stores code data for interfacing with the host.

Figure 19:
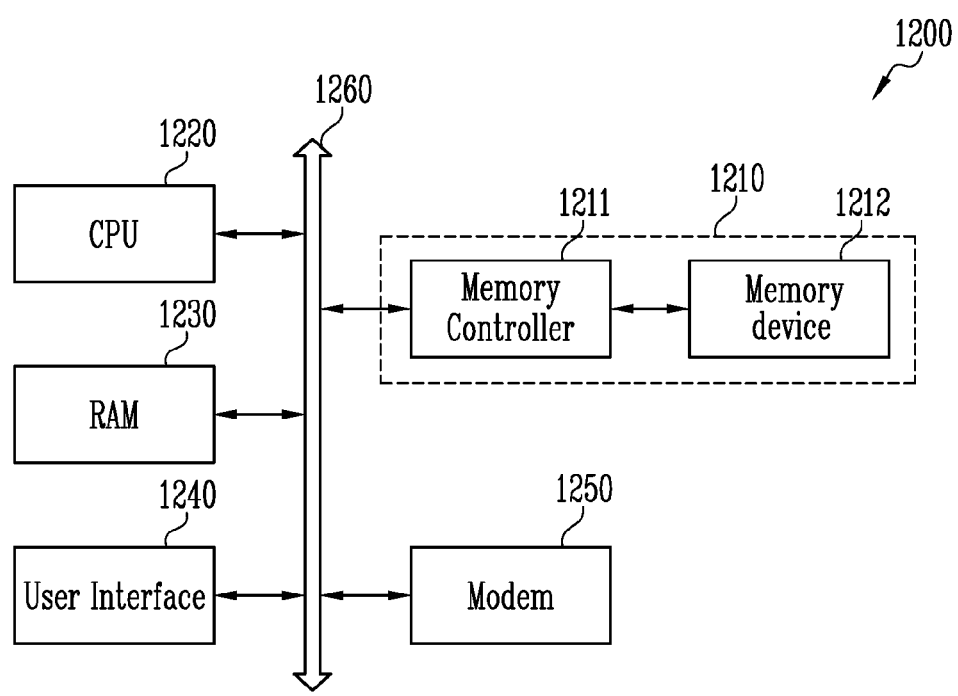
FIG. 19 is a block diagram illustrating the configuration of a computing system according to an embodiment of the present disclosure.

FIG. 19 is a block diagram illustrating a configuration of a computing system 1200 according to an embodiment of the present disclosure.

Referring to FIG. 19, the computing system 1200 may include a CPU 1220, random access memory (RAM) 1230, a user interface 1240, a modem 1250, and a memory system 1210 which are electrically connected to a system bus 1260. The computing system 1200 may be a mobile device.

The memory system 1210 may include a memory device 1212 and a memory controller 1211. The memory device 1212 and the memory controller 1211 may be configured in the same manner as the memory device 1120 and the memory controller 1110 as described above with reference to FIG. 18.

According to embodiments of the present disclosure, a test pattern including a liner insulating layer and a liner semiconductor layer may be formed in a multifunctional stack by using a process of forming a three-dimensional memory cell array structure. Accordingly, in various embodiments, reliability of data obtained using the test pattern according to the present disclosure may be improved.

What is claimed is:

1. A semiconductor memory device, comprising:
a first doped semiconductor layer and a second doped semiconductor layer each comprising an upper surface facing a first direction, the first and second doped semiconductor layers spaced apart from each other;
a multifunctional stack including a plurality of first interlayer insulating layers and a plurality of first conductive layers stacked alternately with each other in the first direction above the first doped semiconductor layer, the multifunctional stack including a groove;
a liner insulating layer on a bottom surface of the groove;
a liner semiconductor layer on the liner insulating layer;
a first electrode located in the grove and extending in the first direction from the liner semiconductor layer;
a second electrode located in the grove and extending in the first direction from the liner semiconductor layer, wherein the first electrode and the second electrode are spaced apart from each other;
a gate stack including a plurality of second interlayer insulating layers and a plurality of second conductive layers stacked alternately with each other in the first direction on the second doped semiconductor layer, the gate stack including a vertical hole;
a memory layer on a side portion of the vertical hole; and
a vertical semiconductor layer arranged on the memory layer.

2. The semiconductor memory device of claim 1, wherein at least one of the plurality of first conductive layers is located between the liner insulating layer and the first doped semiconductor layer, and
wherein each of the vertical hole, the memory layer, and the vertical semiconductor layer extends to pass through the plurality of second conductive layers from an uppermost second conductive layer to a lowermost second conducive layer.

3. The semiconductor memory device of claim 1, wherein the bottom surface of the groove is located at a higher level than a bottom surface of the vertical hole in the first direction.

4. The semiconductor memory device of claim 1,
wherein the multifunctional stack is arranged at substantially a same level as the gate stack,
wherein the plurality of first interlayer insulating layers include substantially a same insulating material as the plurality of second interlayer insulating layers, and
wherein the plurality of first conductive layers include substantially a same conductive material as the plurality of second conductive layers.

5. The semiconductor memory device of claim 1, wherein the liner insulating layer includes substantially a same material layer as the memory layer.

6. The semiconductor memory device of claim 1, wherein each of the liner insulating layer and the memory layer includes a floating gate layer, an insulating layer including conductive nanodots, a charge trap layer, a ferroelectric layer, or a phase change layer.

7. The semiconductor memory device of claim 1, wherein the liner semiconductor layer includes substantially a same semiconductor material as the vertical semiconductor layer.

8. The semiconductor memory device of claim 1, wherein each of the liner insulating layer and the liner semiconductor layer extends along a side portion of the groove.

9. The semiconductor memory device of claim 1, further comprising:
a source wire connected to the first electrode; and
a drain wire connected to the second electrode.

10. The semiconductor memory device of claim 1, further comprising a capacitor wire connected to the first electrode and the second electrode.

11. The semiconductor memory device of claim 1,
wherein the plurality of first conductive layers include a third electrode conductive layer, and
wherein the third electrode conductive layer defines the bottom surface of the groove.

12. The semiconductor memory device of claim 11, further comprising:
a contact plug extending from the third electrode conductive layer in the first direction; and
a wire connected to the contact plug and configured to transfer a signal to the third electrode conductive layer.

13. A semiconductor memory device, comprising:
a doped semiconductor layer including an upper surface facing a first direction;
a multifunctional stack including a plurality of interlayer insulating layers and a plurality of conductive layers stacked alternately with each other in the first direction above the doped semiconductor layer, the multifunctional stack including a groove;
a liner insulating layer on a bottom surface of the groove;
a liner semiconductor layer on the liner insulating layer; and
a first electrode located in the grove and extending in the first direction from the liner semiconductor layer; and
a second electrode located in the grove and extending in the first direction from the liner semiconductor layer, wherein the first electrode and the second electrode are spaced apart from each other,
wherein at least one of the plurality of conductive layers is located between the liner insulating layer and the doped semiconductor layer.

14. The semiconductor memory device of claim 13, wherein each of the liner insulating layer and the liner semiconductor layer extends along a side portion of the groove.

15. The semiconductor memory device of claim 13, further comprising:
a source wire connected to the first electrode; and
a drain wire connected to the second electrode.

16. The semiconductor memory device of claim 13, further comprising a capacitor wire connected to the first electrode and the second electrode.

17. The semiconductor memory device of claim 13,
wherein the plurality of conductive layers include a third electrode conductive layer, and
wherein the third electrode conductive layer defines the bottom surface of the groove.

18. The semiconductor memory device of claim 17, further comprising:
a contact plug extending from the third electrode conductive layer in the first direction; and
a wire connected to the contact plug and configured to transfer a signal to the third electrode conductive layer.

19. The semiconductor memory device of claim 18,
wherein the plurality of conductive layers are stacked to define a stepped structure, and
wherein the contact plug is connected to an end portion of the third electrode conductive layer corresponding to the stepped structure.

20. A semiconductor memory device, comprising:
a first doped semiconductor layer and a second doped semiconductor layer each comprising an upper surface facing a first direction, the first and second doped semiconductor layers spaced apart from each other;
a test group overlapping the first doped semiconductor layer; and
a three-dimensional memory cell array structure overlapping the second doped semiconductor layer,
wherein the test group comprises:
a plurality of multifunctional stacks including a plurality of interlayer insulating layers and a plurality of conductive layers stacked alternately with each other in the first direction above the first doped semiconductor layer, the plurality of multifunctional stacks including a plurality of grooves;
a plurality of liner insulating layers arranged on a plurality of bottom surfaces corresponding to the plurality of grooves, respectively;
a plurality of liner semiconductor layers arranged on the plurality of liner insulating layers, respectively;
a plurality of filling insulating layers arranged in the plurality of grooves; and
a plurality of electrode pairs passing through the plurality of filling insulating layers and connected to the plurality of liner semiconductor layers.

21. The semiconductor memory device of claim 20, wherein each of the plurality of liner insulating layers and the plurality of liner semiconductor layers extends along a side portion of a corresponding groove among the plurality of grooves.

22. The semiconductor memory device of claim 20, wherein the first doped semiconductor layer includes a transistor region and a capacitor region.

23. The semiconductor memory device of claim 22,
wherein the plurality of multifunctional stacks include a first multifunctional stack over the transistor region,
wherein the plurality of grooves include a plurality of first grooves in the first multifunctional stack,
wherein the first multifunctional stack includes a gate electrode conductive layer located between the first doped semiconductor layer and the plurality of first grooves,
wherein the plurality of liner semiconductor layers include a plurality of first liner semiconductor layers corresponding to the plurality of first grooves,
wherein the plurality of electrode pairs include a plurality of first electrode pairs corresponding to the plurality of liner semiconductor layers, and
wherein the plurality of first electrode pairs include a plurality of first source electrodes corresponding to the plurality of liner semiconductor layers and a plurality of first drain electrodes corresponding to the plurality of first liner semiconductor layers.

24. The semiconductor memory device of claim 23, further comprising:
a gate wire connected to the gate electrode conductive layer;
a plurality of source wires connected to the plurality of first source electrodes, respectively; and
a plurality of drain wires connected to the plurality of first drain electrodes, respectively.

25. The semiconductor memory device of claim 22,
wherein the plurality of multifunctional stacks include a first multifunctional stack and a second multifunctional stack over the transistor region,
wherein the plurality of grooves include a first groove in the first multifunctional stack and a second groove in the second multifunctional stack,
wherein the first multifunctional stack includes a first gate electrode conductive layer located between the first doped semiconductor layer and the first groove,
wherein the second multifunctional stack includes a second gate electrode conductive layer located between the first doped semiconductor layer and the second groove,
wherein the plurality of liner semiconductor layers include a first liner semiconductor layer in the first groove and a second liner semiconductor layer in the second groove, and
wherein the plurality of electrode pairs include a first electrode pair comprising a first source electrode and a first drain electrode extending in the first direction from the first liner semiconductor layer and a second electrode pair comprising a second source electrode and a second drain electrode extending in the first direction from the second liner semiconductor layer.

26. The semiconductor memory device of claim 25, further comprising:
a first gate wire connected to the first gate electrode conductive layer;
a second gate wire connected to the second gate electrode conductive layer;
a first source wire connected to the first source electrode;
a second source wire connected to the second source electrode;
a first drain wire connected to the first drain electrode; and
a second drain wire connected to the second drain electrode.

27. The semiconductor memory device of claim 25, wherein a distance between the first source electrode and the first drain electrode is different from a distance between the second source electrode and the second drain electrode.

28. The semiconductor memory device of claim 22,
wherein the plurality of multifunctional stacks include a first multifunctional stack overlapping the capacitor region,
wherein the plurality of grooves include a plurality of first grooves passing through the first multifunctional stack,
wherein the first multifunctional stack includes a lower electrode conductive layer located between the first doped semiconductor layer and the plurality of first grooves,
wherein the plurality of liner semiconductor layers include a plurality of first liner semiconductor layers corresponding to the plurality of first grooves, and
wherein the plurality of electrode pairs include a plurality of first electrode pairs corresponding to the plurality of first liner semiconductor layers.

29. The semiconductor memory device of claim 28, further comprising:
a first capacitor wire connected to the lower electrode conductive layer; and
a second capacitor wire connected to the plurality of first electrode pairs.

30. The semiconductor memory device of claim 22,
wherein the plurality of multifunctional stacks include a first multifunctional stack and a second multifunctional stack overlapping the capacitor region,
wherein the plurality of grooves include a first groove in the first multifunctional stack and a second groove in the second multifunctional stack,
wherein the first multifunctional stack includes a first lower electrode conductive layer located between the first doped semiconductor layer and the first groove,
wherein the second multifunctional stack includes a second lower electrode conductive layer located between the first doped semiconductor layer and the second groove,
wherein the plurality of liner semiconductor layers include a first liner semiconductor layer in the first groove and a second liner semiconductor layer in the second groove, and
wherein the plurality of electrode pairs include a first electrode pair extending in the first direction from the first liner semiconductor layer and a second electrode pair extending in the first direction from the second liner semiconductor layer.

31. The semiconductor memory device of claim 30, further comprising:
a first contact plug extending in the first direction from the first lower electrode conductive layer;
a second contact plug extending in the first direction from the second lower electrode conductive layer;
a first capacitor wire connected to the first contact plug and the second contact plug; and
a second capacitor wire connected to the first electrode pair and the second electrode pair.

32. A method of manufacturing a semiconductor memory device, the method comprising:
forming a multifunctional stack including a groove and a gate stack including a vertical hole;
forming a memory layer on a side portion of the vertical hole;
forming a liner insulating layer on a surface of the groove while the memory layer is formed;
forming a vertical semiconductor layer on the memory layer;
forming a liner semiconductor layer on the liner insulating layer while the vertical semiconductor layer is formed; and
forming a first electrode and a second electrode connected to the liner semiconductor layer and spaced apart from each other in the groove.

33. The method of claim 32,
wherein the multifunctional stack and the gate stack are formed on a first doped semiconductor layer and a second doped semiconductor layer separated from each other,
wherein the multifunctional stack includes a plurality of first interlayer insulating layers and a plurality of first conductive layers stacked alternately with each other on the first doped semiconductor layer, and
wherein the gate stack includes a plurality of second interlayer insulating layers and a plurality of second conductive layers stacked alternately with each other on the second doped semiconductor layer.

34. The method of claim 33,
wherein one of the plurality of first conductive layers includes an electrode layer extending along a bottom surface of the groove, and
wherein the vertical hole passes through the plurality of second interlayer insulating layers and the plurality of second conductive layers to expose the second doped semiconductor layer through the vertical hole.

35. The method of claim 34, wherein the vertical semiconductor layer is connected to the second doped semiconductor layer.

36. The method of claim 32, wherein the vertical hole has a greater depth than the groove.

* * * * *